United States Patent
Tao et al.

(10) Patent No.: US 12,094,990 B1
(45) Date of Patent: Sep. 17, 2024

(54) PHOTOVOLTAIC CURTAIN WALL AND METHOD FOR MANUFACTURING PHOTOVOLTAIC CURTAIN WALL

(71) Applicants: JINKO SOLAR (HAINING) CO., LTD., Haining (CN); ZHEJIANG JINKO SOLAR CO., LTD., Haining (CN)

(72) Inventors: Chunhua Tao, Haining (CN); Neng Fang, Haining (CN); Pengjun Xiao, Haining (CN); Biao Cui, Haining (CN); Juan Wang, Haining (CN); Sen Yang, Haining (CN); Zhigang Dai, Haining (CN); Bo Li, Haining (CN)

(73) Assignees: JINKO SOLAR (HAINING) CO., LTD., Zhejiang (CN); ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 18/446,454

(22) Filed: Aug. 8, 2023

(30) Foreign Application Priority Data

Mar. 9, 2023 (CN) .......................... 202310246932.3
Mar. 9, 2023 (CN) .......................... 202310254785.4
Mar. 9, 2023 (CN) .......................... 202320509104.X

(51) Int. Cl.
*H01L 31/048* (2014.01)
*E04B 2/88* (2006.01)
*H01L 31/18* (2006.01)

(52) U.S. Cl.
CPC ............ *H01L 31/0488* (2013.01); *E04B 2/88* (2013.01); *H01L 31/186* (2013.01)

(58) Field of Classification Search
None
See application file for complete search history.

(56) References Cited

U.S. PATENT DOCUMENTS 6,075,201 A * 6/2000 Wambach ............... H02S 20/23
126/621
2019/0006547 A1   1/2019 Watts et al.
(Continued)

FOREIGN PATENT DOCUMENTS

CN    101478010 A    7/2009
CN    101866962 A    10/2010
(Continued)

OTHER PUBLICATIONS

Jinko Solar (Haining) Co., Ltd., et al., Extended European Search Report, EP 23191105.8, Jan. 19, 2024, 9 pgs.
(Continued)

*Primary Examiner* — Jayne L Mershon
(74) *Attorney, Agent, or Firm* — USCH Law, PC

(57) ABSTRACT

A photovoltaic curtain wall and a method for manufacturing the photovoltaic curtain wall are provided. The photovoltaic curtain wall includes a first cover plate, a cell string, and a second cover plate stacked sequentially in a first direction; and an encapsulation film including a first adhesive film and a second adhesive film, the first adhesive film is attached to the first cover plate, and the second adhesive film is attached to the second cover plate. The second cover plate has a thickness greater than or equal to an equivalent thickness, and the first cover plate has a thickness less than the thickness of the second cover plate; and the equivalent thickness is a thickness of a target cover plate that undergoes a preset bending deformation in response to a preset load, and the target cover plate and the second cover plate is made of a same material.

18 Claims, 9 Drawing Sheets

(56) References Cited

U.S. PATENT DOCUMENTS

| | | |
|---|---|---|
| 2019/0140121 A1 | 5/2019 | Ueda et al. |
| 2019/0189823 A1* | 6/2019 | Zhang ................. H01L 31/0512 |
| 2022/0140773 A1 | 5/2022 | Zhang et al. |
| 2022/0149213 A1 | 5/2022 | Mensink et al. |
| 2022/0231179 A1* | 7/2022 | Onozaki ............. H01L 31/0488 |
| 2023/0067441 A1* | 3/2023 | Palm ....................... H02S 20/26 |

FOREIGN PATENT DOCUMENTS

| | | |
|---|---|---|
| CN | 202712225 U | 1/2013 |
| CN | 106449825 B | 3/2018 |
| CN | 214152916 U | 9/2021 |
| CN | 217239479 U | 8/2022 |
| EP | 3567639 A1 | 11/2019 |
| JP | H10256584 A | 9/1998 |
| JP | 2002185031 A | 6/2002 |
| JP | 2010219518 A | 9/2010 |
| JP | 2012204458 A | 10/2012 |
| JP | 2015029077 A | 2/2015 |
| JP | 2015119008 A | 6/2015 |
| JP | 2017107922 A | 6/2017 |
| JP | 2019197879 A | 11/2019 |
| JP | 2020072275 A | 5/2020 |
| JP | 2021512508 A | 5/2021 |
| JP | 2022518596 A | 3/2022 |
| WO | 2012176419 A1 | 12/2012 |
| WO | 2016157684 A1 | 10/2016 |

OTHER PUBLICATIONS

Jinko Solar (Haining) Co., Ltd., et al., Examination report No. 1 for standard patent application, AU 2023216746, May 30, 2024, 12 pgs.

* cited by examiner

PHOTOVOLTAIC CURTAIN WALL AND METHOD FOR MANUFACTURING PHOTOVOLTAIC CURTAIN WALL

CROSS REFERENCE TO RELATED APPLICATIONS

The present application claims the benefit of priority under the Paris Convention to Chinese Patent Application No. 202320509104.X filed on Mar. 9, 2023, Chinese Patent Application No. 202310246932.3 filed on Mar. 9, 2023, and Chinese Patent Application No. 202310254785.4 filed on Mar. 9, 2023, each of which is incorporated herein by reference in its entirety.

TECHNICAL FIELD

The various embodiments described in this document relate in general to the technical field of solar cells, and more specifically to a photovoltaic curtain wall and a method for manufacturing the photovoltaic curtain wall.

BACKGROUND

Fossil energy has air pollution and limited reserves, while solar energy has advantages of cleanliness, no pollution, and abundant resources. Therefore, the solar energy is gradually becoming a core clean energy to replace the fossil energy. Since the solar cell has good photoelectric conversion efficiency, the solar cell has become the development focus of clean energy utilization.

In order to reduce carbon emissions, photovoltaic building integration is becoming an important direction of building energy efficiency. Existing photovoltaic building integration is mainly used in curtain walls, industrial and commercial roofs, and building roofs. The photovoltaic curtain wall is a manifestation of the photovoltaic building integration, that is, photovoltaic modules are organically combined with the traditional curtain wall to make the curtain wall have power generation capacity. At present, the curtain wall module is generally formed by sandwiching photovoltaic cell strings between two cover plates.

However, at present, the photoelectric conversion efficiency of the photovoltaic curtain wall is low and the power generation is limited.

SUMMARY

Embodiments of the disclosure provide a photovoltaic curtain wall and a method for manufacturing the photovoltaic curtain wall, which is at least conducive to improve the photoelectric conversion efficiency and power generation of the photovoltaic curtain wall.

In some embodiments, a photovoltaic curtain wall is provided. The photovoltaic curtain wall includes a first cover plate, a cell string, and a second cover plate stacked sequentially in a first direction; and an encapsulation film disposed between the first cover plate and the second cover plate and wrapping the cell string. The encapsulation film includes a first adhesive film and a second adhesive film, the first adhesive film is attached to the first cover plate, and the second adhesive film is attached to the second cover plate. The second cover plate has a thickness greater than or equal to an equivalent thickness, and the first cover plate has a thickness less than the thickness of the second cover plate; and the equivalent thickness is a thickness of a target cover plate that is made of a same material as the second cover plate and that undergoes a preset bending deformation in response to a preset load.

In some embodiments, a thickness difference between the first cover plate and the second cover plate is greater than 3 mm.

In some embodiments, the thickness difference between the first cover plate and the second cover plate is in a range of 3 mm to 15 mm.

In some embodiments, the thickness of the first cover plate is in a range of 1 mm to 4 mm.

In some embodiments, the cell string has a first surface facing the first cover plate and a second surface facing the second cover plate; and the first cover plate is spaced from the first surface by 0.35 mm to 1.2 mm, and the second cover plate is spaced from the second surface by 0.75 mm to 3 mm in the first direction.

In some embodiments, the cell string includes a plurality of sub-cell strings arranged at intervals in a second direction; and a spacing between any two adjacent sub-cell strings of the plurality of sub-cell strings is in a range of 3 mm to 200 mm in the second direction.

In some embodiments, each respective sub-cell string includes a plurality of cells arranged in a third direction; and an interval between any two adjacent cells of the plurality of cells is in a range of −1.5 mm to 200 mm in the third direction.

In some embodiments, each respective cell of the plurality of cells includes a crystalline silicon cell, a cadmium telluride thin film cell, a copper indium gallium selenium thin film cell, a silicon-based thin film solar cell, or a laminated solar cell.

In some embodiments, each respective cell of the plurality of cells includes 2 to 20 main bus bars arranged at intervals.

In some embodiments, the photovoltaic curtain wall further includes a first functional film located on a surface of the first cover plate away from the encapsulation film, and the first functional film includes an antireflection film, an anti-glare film, or a self-cleaning film.

In some embodiments, the encapsulation film further includes: a third adhesive film laid between the first adhesive film and the second adhesive film, where the third adhesive film is facing an edge of the second cover plate, and the edge of the second cover plate is not covered by an orthographic projection of the cell string on the second cover plate.

In some embodiments, the third adhesive film has a width greater than or equal to 10 mm. The photovoltaic curtain wall further includes a fourth adhesive film between target sub-cell strings of a plurality of sub-cell strings of the cell string, and the fourth adhesive film is respectively bonded with the first adhesive film and the second adhesive film, where the target sub-cell strings are adjacent sub-cell strings among the plurality of sub-cell strings, and a spacing between the target sub-cell strings in the second direction is greater than or equal to a preset value.

In some embodiments, the cell string includes output wires, and at least one lead-wire opening is defined on the first cover plate or the second cover plate, and the at least one lead-wire opening is used for leading out the output wires.

In some embodiments, the first adhesive film completely covers a surface of the first cover plate in contact with the first adhesive film, and an interval between an edge of the first adhesive film and an edge of the first cover plate is greater than 3 mm; and the second adhesive film completely covers a surface of the second cover plate in contact with the second adhesive film, and an interval between an edge of the second adhesive film and the edge of the second cover plate is greater than 3 mm.

In some embodiments, a method for manufacturing a photovoltaic curtain wall is provided. The method is used for manufacturing the photovoltaic curtain wall described above. The method includes: providing the first cover plate; bonding the first adhesive film with the first cover plate; bonding a first surface of the cell string with a surface of the first adhesive film facing away from the first cover plate; bonding the second adhesive film with a second surface of the cell string opposite to the first surface; bonding the second cover plate with a surface of the second adhesive film away from the cell string; and performing a laminating process on the first cover plate, the first adhesive film, the cell string, the second adhesive film, and the second cover plate to form the photovoltaic curtain wall, where the second cover plate has a thickness greater than or equal to an equivalent thickness, and the first cover plate has a thickness less than the thickness of the second cover plate; and the equivalent thickness is a thickness of a target cover plate that is made of a same material as the second cover plate and that undergoes a preset bending deformation in response to a preset load.

In some embodiments, the method further includes: forming a third adhesive film between the first adhesive film and the second adhesive film, the third adhesive film is facing an edge of the second cover plate, and the edge of the second cover plate is not covered by an orthographic projection of the cell string on the second cover plate.

In some embodiments, the third adhesive film has a width greater than or equal to 10 mm.

In some embodiments, the cell string includes a plurality of sub-cell strings arranged at intervals in a second direction, and the method further includes: forming a fourth adhesive film between target sub-cell strings of the plurality of sub-cell strings, and the fourth adhesive film is respectively bonded with the first adhesive film and the second adhesive film, where the target sub-cell strings are adjacent sub-cell strings among the plurality of sub-cell strings, and a spacing between the target sub-cell strings in the second direction is greater than or equal to a preset value.

In some embodiments, the cell string includes output wires, and the method further includes: defining at least one lead-wire opening on the first cover plate or the second cover plate, where the at least one lead-wire opening is used for leading out the output wires.

In some embodiments, the first cover plate or the second cover plate includes a third surface adjacent to the cell string, and the method further includes: providing a fifth adhesive film, and an opening region on the third surface is within an orthographic projection of the fifth adhesive film on the third surface.

In some embodiments, providing the first adhesive film includes: providing the first adhesive film that completely covers a surface of the first cover plate in contact with the first adhesive film, where an interval between an edge of the first adhesive film and an edge of the first cover plate is greater than 3 mm.

In some embodiments, providing the second adhesive film includes: providing the second adhesive film that completely covers a surface of the second cover plate in contact with the second adhesive film, where an interval between an edge of the second adhesive film and the edge of the second cover plate is greater than 3 mm.

In some embodiments, the laminating process includes: laminating by a laminator and/or an autoclave.

In some embodiments, the method further includes: providing at least one bypass diode for the cell string.

BRIEF DESCRIPTION OF THE DRAWINGS

One or more embodiments are illustrated by the figures in the corresponding drawings, which are not to be limiting to the embodiments, and the figures in the drawings are not to be limiting to scale unless specifically stated.

DETAILED DESCRIPTION OF THE EMBODIMENTS

Figure 1:
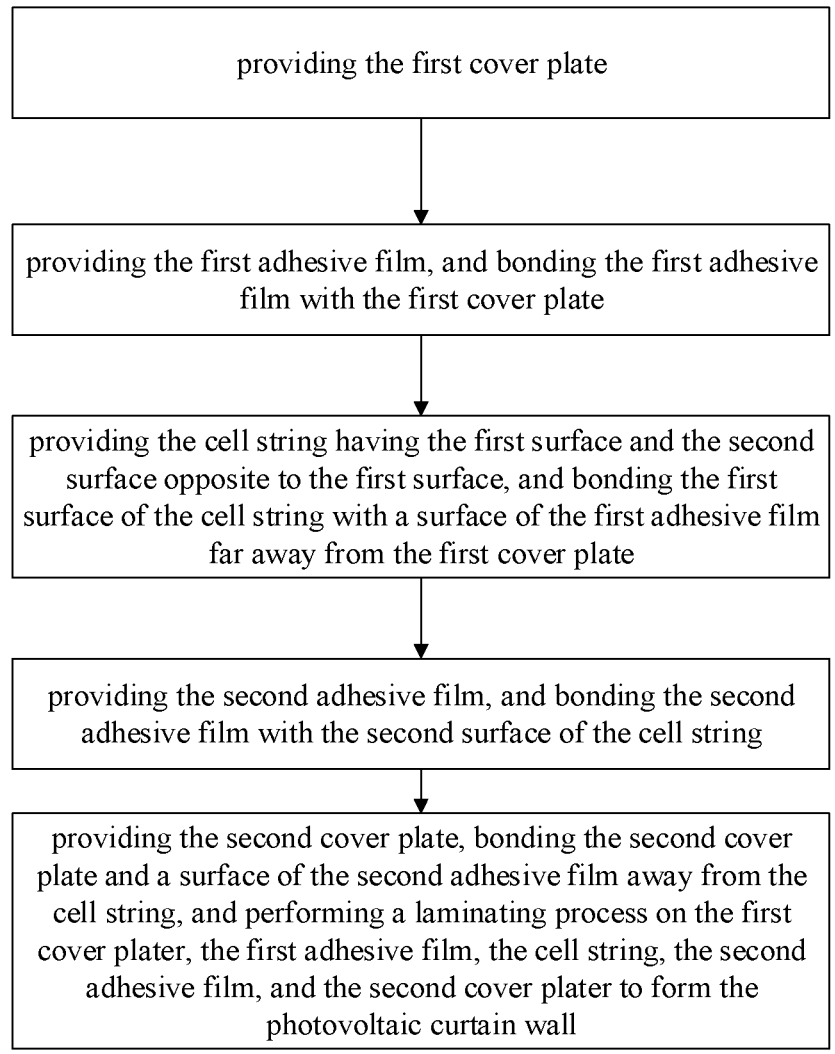
FIG. 1 is a flow chart of a method for manufacturing a photovoltaic curtain wall according to embodiments of the present disclosure.

It can be seen from the background technology that the photoelectric conversion efficiency of the current photovoltaic curtain wall module is low and the power generation is limited.

According to a first aspect, embodiments of the disclosure provide a photovoltaic curtain wall, including: a first cover plate, a cell string, and a second cover plate which are stacked in a first direction; an encapsulation film disposed between the first cover plate and the second cover plate and wrapping the cell string; the second cover plate has a thickness greater than or equal to an equivalent thickness, and the first cover plate has a thickness less than the thickness of the second cover plate; the equivalent thickness is a thickness of a target cover plate that is made of a same material as the second cover plate and that undergoes a preset bending deformation in response to a preset load.

In addition, a thickness difference between the first cover plate and the second cover plate is greater than 3 mm.

In addition, the thickness difference between the first cover plate and the second cover plate is in a range of 3 mm to 15 mm.

In addition, the thickness of the first cover plate is in a range of 1 mm to 4 mm.

In addition, the cell string has a first surface facing the first cover plate and a second surface facing the second cover plate; the first cover plate is spaced from the first surface by 0.35 mm to 1.2 mm, and the second cover plate is spaced from the second surface by 0.75 mm to 3 mm in the first direction.

In addition, the cell string includes a plurality of sub-cell strings arranged at intervals in a second direction; a spacing between any two adjacent sub-cell strings of the plurality of sub-cell strings is in a range of 3 mm to 200 mm in the second direction.

In addition, the photovoltaic curtain wall further includes: a first functional film located on a surface of the first cover plate far away from the encapsulation film; and the first functional film includes an antireflection film, an anti-glare film, or a self-cleaning film.

In addition, each respective sub-cell string includes a plurality of cells arranged in a third direction; an interval between any two adjacent cells of the plurality of cells is in a range of −1.5 mm to 200 mm in the third direction.

In addition, each respective cell of the plurality of cells includes a crystalline silicon cell, a cadmium telluride thin film cell, a copper indium gallium selenium thin film cell, a silicon-based thin film solar cell, or a laminated solar cell.

In addition, each respective cell of the plurality of cells includes 2 to 20 main bus bars arranged at intervals.

The technical proposal provided in the embodiment of the disclosure has at least the following advantages.

According to embodiments of the disclosure, the photovoltaic curtain wall includes the first cover plate, the cell string, and the second cover plate which are laminated in the first direction; and the encapsulation film arranged between the first cover plate and the second cover plate to form the photovoltaic curtain wall. During selecting of the second cover plate, the bending deformation occurred under the preset load is taken as the preset bending deformation, and the thickness of the target cover plate with the same material as the second cover plate is taken as the equivalent thickness, and the second cover plate of which thickness is greater than or equal to the equivalent thickness and the first cover plate of which thickness is less than the second cover plate are selected to form the photovoltaic curtain wall. By taking the thickness of the target cover plate with the same material as the second cover plate and the bending deformation under the preset load as the preset bending deformation as the equivalent thickness, and selecting the second cover plate with the thickness greater than or equal to the equivalent thickness for preparing the photovoltaic curtain wall, the second cover plate can independently bear the strength requirement for the photovoltaic curtain wall. Therefore, when selecting the first cover plate, the first cover plate with the thickness less than the second cover plate can be selected, and the thickness of the selected first cover plate can be reduced further to improve the light transmittance of the first cover plate, thereby increasing the light energy received by the cell string and increasing the number of photo-generated carriers generated by the cell string on the basis of ensuring the mechanical strength of the photovoltaic curtain wall, thereby improving the photoelectric conversion efficiency and power generation of the photovoltaic curtain wall.

According to a second aspect, embodiments of the disclosure provide a method for manufacturing a photovoltaic curtain wall, and the method includes: providing a first cover plate; providing a first adhesive film, and bonding the first adhesive film with the first cover plate; providing a cell string having an opposite first surface and a second surface, and bonding the first surface of the cell string with the surface of the first adhesive film far away from the first cover plate; providing a second adhesive film, and bonding the second adhesive film with the second surface of the cell string; providing a second cover plate, bonding the second cover plate and the second adhesive film away from the surface of the cell string, and adopting a laminating process to form the photovoltaic curtain wall; the second cover plate has a thickness greater than or equal to an equivalent thickness, and the first cover plate has a thickness less than the thickness of the second cover plate; and the equivalent thickness is a thickness of a target cover plate that is made of a same material as the second cover plate and that undergoes a preset bending deformation in response to a preset load.

In some embodiments, the method further includes: forming a third adhesive film between the first adhesive film and the second adhesive film, the third adhesive film is facing an edge of the second cover plate, and the edge of the second cover plate is not covered by an orthographic projection of the cell string on the second cover plate.

In some embodiments, the third adhesive film has a width greater than or equal to 10 mm.

In some embodiments, the cell string includes a plurality of sub-cell strings arranged at intervals in a second direction, and the method further includes: forming a fourth adhesive film between target sub-cell strings of the plurality of sub-cell strings, and the fourth adhesive film is respectively bonded with the first adhesive film and the second adhesive film, where the target sub-cell strings are adjacent sub-cell strings among the plurality of sub-cell strings, and a spacing between the target sub-cell strings in the second direction is greater than or equal to a preset value.

In some embodiments, the cell string includes output wires, and the method further includes: defining at least one lead-wire opening on the first cover plate or the second cover plate, where the at least one lead-wire opening is used for leading out the output wires.

In some embodiments, the first cover plate or the second cover plate includes a third surface adjacent to the cell string, and the method further includes: providing a fifth adhesive film, and an opening region on the third surface is within an orthographic projection of the fifth adhesive film on the third surface.

In some embodiments, providing the first adhesive film includes: providing the first adhesive film that completely covers a surface of the first cover plate in contact with the first adhesive film, where an interval between an edge of the first adhesive film and an edge of the first cover plate is greater than 3 mm.

In some embodiments, providing the second adhesive film includes: providing the second adhesive film that completely covers a surface of the second cover plate in contact with the second adhesive film, where an interval between an edge of the second adhesive film and the edge of the second cover plate is greater than 3 mm.

In some embodiments, the laminating process includes: laminating by a laminator and/or an autoclave.

In some embodiments, the method further includes: providing at least one bypass diode for the cell string.

According to a third aspect, embodiments of the disclosure provide a photovoltaic curtain wall, which is manufactured by the method for manufacturing the photovoltaic curtain wall described in the second aspect. The method includes: the first cover plate, the cell string, and the second cover plate that are sequentially stacked; and encapsulation film located between the first cover plate and the second cover plate, and covering the cell string.

According to the method for manufacturing the photovoltaic curtain wall and the photovoltaic curtain wall, the first cover plate, the first adhesive film, the cell string, the second adhesive film, and the second cover plate are provided, the first adhesive film is respectively attached to the first cover plate and the cell string, the second adhesive film is respectively attached to the second cover plate and the cell string, and then the photovoltaic curtain wall is formed by a laminating process. Before providing the first cover plate and the second cover plate, the bending deformation occurred under the preset load is taken as a preset bending deformation, and a thickness of the target cover plate being made of the same material as the second cover plate is taken as the equivalent thickness, and then a second cover plate with a thickness greater than or equal to the equivalent thickness and a first cover plate with a thickness less than the second cover plate are provided to prepare the photovoltaic curtain wall. By taking the thickness of the target cover plate which is made of the same material as the second cover plate and undergoes the preset bending deformation is response to the preset load as the equivalent thickness, and selecting the second cover plate of which thickness is greater than or equal to the equivalent thickness to prepare the photovoltaic curtain wall, the second cover plate can independently bear the strength requirement for the photovoltaic curtain wall. Therefore, when selecting the first cover plate, the first cover plate of which thickness is less than the second cover plate can be selected, and the thickness of the selected first cover plate can be reduced further to improve the light transmittance of the first cover plate, thereby increasing the light energy received by the cell string and increasing the number of photo-generated carriers generated by the cell string on the basis of ensuring the mechanical strength of the photovoltaic curtain wall, thereby improving the photoelectric conversion efficiency and power generation of the formed photovoltaic curtain wall.

According to a fourth aspect, embodiments of the disclosure provide a photovoltaic curtain wall, including: a first cover plate, a cell string, and a second cover plate which are stacked in a first direction; and an encapsulation film positioned between the first cover plate and the second cover plate and covering the cell string; in the first direction, a thickness of the first cover plate is smaller than a thickness of the second cover plate, and the thickness of the first cover plate is in a range of 1 mm to 4 mm, and a surface of the encapsulation film in contact with the first cover plate is spaced from the cell string by 0.35 mm to 1.2 mm.

In some embodiments, in the first direction, the thickness of the second cover plate is greater than or equal to an equivalent thickness; the equivalent thickness is the thickness of the target cover plate satisfying a preset condition, a material of the target cover plate is the same as that of the second cover plate, and the preset condition includes that the target cover plate undergoes a preset bending deformation in response to a preset load.

In addition, when the thickness of the first cover plate is less than or equal to 2 mm, a thickness of the encapsulation film between the first cover plate and the cell string is 0.3 mm to 1.2 mm.

In addition, when the thickness of the first cover plate is greater than 2 mm and less than or equal to 4 mm, a thickness of the encapsulation film between the first cover plate and the cell string is 0.75 mm to 1.2 mm.

In addition, the thickness of the encapsulation film between the second cover plate and the cell string is 0.75 mm to 3 mm.

In addition, when the thickness of the second cover plate is less than or equal to 6 mm, the thickness of the encapsulation film between the second cover plate and the cell string is 0.7 mm to 1.6 mm.

In addition, when the thickness of the second cover plate is greater than 8 mm and less than or equal to 12 mm, the thickness of the encapsulation film between the second cover plate and the cell string is 1.1 mm to 1.6 mm.

In addition, when the thickness of the second cover plate is greater than or equal to 15 mm, the thickness of the encapsulation film between the second cover plate and the cell string is 1.5 mm to 3 mm.

In addition, the cell string includes a plurality of cells arranged in a third direction; in the third direction, an interval between any two adjacent cells of the plurality of cells is in a range of −1.5 mm to 200 mm.

In addition, the cell string includes output wires, and at least one lead-wire opening is defined on the first cover plate, the second cover plate, or the encapsulation film, where the at least one lead-wire opening is used for leading out the output wires.

The technical proposal provided in embodiments of the disclosure has at least the following advantages.

The photovoltaic curtain wall provided in the embodiments of the present disclosure includes the first cover plate, the cell string, and the second cover plate laminated in a first direction; and an encapsulation film disposed between the first cover plate and the second cover plate to form the photovoltaic curtain wall. During selecting of the cover plate forming the photovoltaic curtain wall, the first cover plate with a thickness less than the second cover plate and a thickness of 1 mm to 4 mm is selected to form the photovoltaic curtain wall, and the thickness of the encapsulation film between the first cover plate and the cell string is set in a range of 0.35 mm to 1.2 mm. By selecting the first cover plate with the thickness ranging from 1 mm to 4 mm and smaller than the second cover plate to prepare the photovoltaic curtain wall, the light transmittance of the first cover plate can be effectively improved, and the thickness of the encapsulation film between the first cover plate and the cell string is set in the range of 0.35 mm to 1.2 mm, which can ensure the bonding stability of the photovoltaic curtain wall and effectively control the light absorption of the encapsulation film to the incident light passing through the first cover plate. Combined with the improvement of the light transmittance of the first cover plate, the energy loss when the incident light on the first cover plate passes through the first cover plate and the encapsulation film and reaches the cell string is reduced, the light energy received by the cell string is improved, the photo-generated carriers generated by the cell string are increased, and the photoelectric conversion efficiency and the power generation of the photovoltaic curtain wall are improved.

The embodiments of the disclosure will be described in detail below with reference to the accompanying drawings. However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

Embodiments of the disclosure provide a method for manufacturing a photovoltaic curtain wall, which is applicable to a photovoltaic curtain wall production device. For specific operations of manufacturing the photovoltaic curtain wall, reference may be made to FIG. 1.

Figure 2:
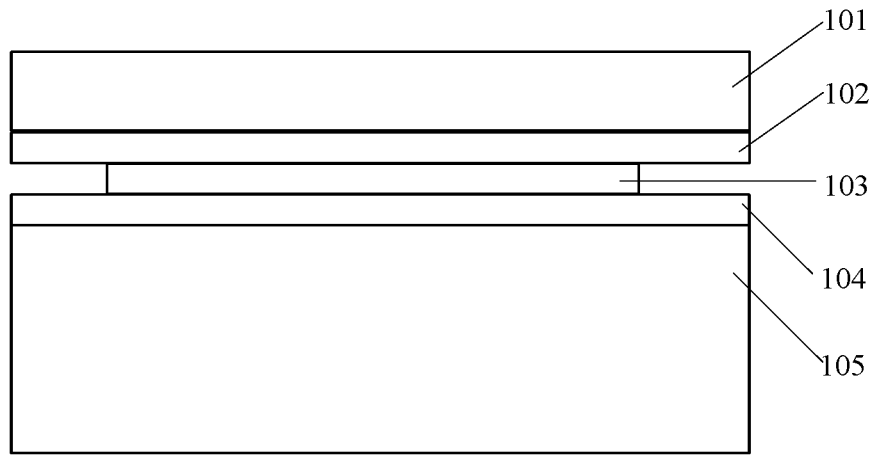
FIG. 2 is a schematic structural diagram of a semi-manufactured product of a photovoltaic curtain wall according to embodiments of the present disclosure.
Figure 3:
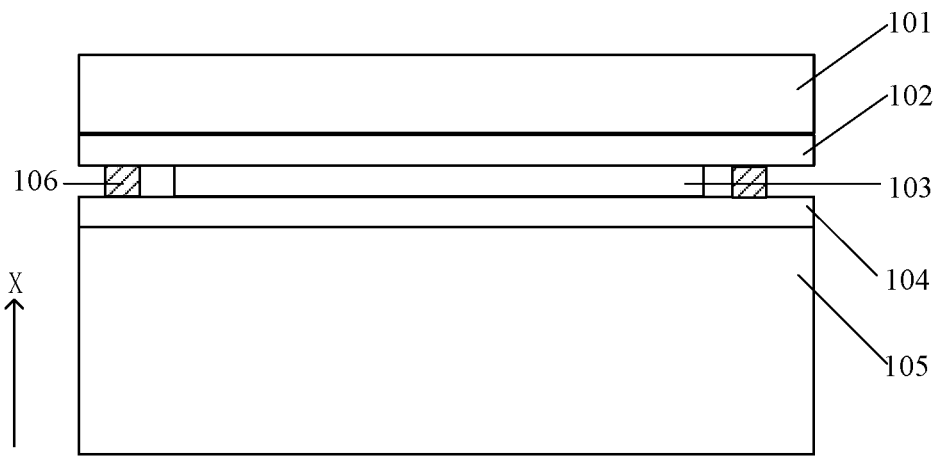
FIG. 3 is a schematic structural diagram of a semi-manufactured product of a photovoltaic curtain wall according to other embodiments of the present disclosure.

As illustrated in FIG. 1 and FIG. 2, a first cover plate 101 is provided. FIG. 2 is a schematic structural diagram of a photovoltaic curtain wall before laminating.

During manufacturing of a photovoltaic curtain wall, according to scenarios where the subsequent photovoltaic curtain wall is applied and the performance requirements of the photovoltaic curtain wall, a cover plate with appropriate material can be selected as the first cover plate 101, and the first cover plate 101 can be placed on a process table. The first cover plate 101 may be a glass cover plate, such as embossed glass, tempered glass, semi-tempered glass, plexiglass, curved glass, etc. Alternatively, the first cover plate 101 may also be a plastic cover plate, such as a polyvinyl fluoride film or an ethylene-tetrafluoroethylene copolymer film, etc.

In addition, when the first cover plate 101 is provided, a surface of the first cover plate 101 can be cleaned by solution cleaning or high-pressure blowing, such that the smoothness of the surface of the first cover plate 101 can be improved and obvious defects of the formed photovoltaic curtain wall due to impurities and the like can be avoided. The solution cleaning can be carried out by water or alcohol, and the high-pressure blowing can be carried out by blowing compressed air or inert gas at an air pressure of 1 to 3 standard atmospheres.

A first adhesive film 102 is provided, and the first adhesive film 102 is bonded (attached) to the first cover plate 101.

Photovoltaic curtain walls are generally manufactured with an adhesive film as an intermediate layer. Therefore, according to the strength or performance requirements of the photovoltaic curtain wall, an adhesive film with appropriate material is selected as the first adhesive film 102. For example, an adhesive film composed of ethylene-vinyl acetate copolymer (EVA), ethylene-octene copolymer (POE), or polyvinyl butyral (PVB) is used as the first adhesive film 102. The first adhesive film 102 is then bonded to the first cover plate 101.

At least one cell string 103 is provided. Each cell string 103 has a first surface and a second surface opposite to the first surface, and the first surface of each cell string 103 is attached to a surface of the first adhesive film 102 away from the first cover plate 101.

During manufacturing of the photovoltaic curtain wall, a plurality of suitable cells can be selected and connected in series and/or in parallel to construct a cell string 103 in the photovoltaic curtain wall. The cells may be selected according to the requirements of the thickness and power of the photovoltaic curtain wall. For example, under the requirement of balancing the power and thickness of photovoltaic curtain wall, crystalline silicon solar cells can be preferentially selected, and the crystalline silicon solar cells can be monocrystalline silicon cells or polycrystalline silicon cells. If the thickness of the photovoltaic curtain wall is required to be as small as possible, thin film solar cells can be selected, such as cadmium telluride thin film cells, copper indium gallium selenium thin film cells, silicon-based thin film solar cells, or perovskite thin film solar cells. Alternatively, if the power of the photovoltaic curtain wall is required to be as large as possible, laminated solar cells or crystalline silicon cells or laminated cells receiving light on both sides can be selected. Therefore, the cell 220 that constructs the cell string 103 may be any combination of one or more of a crystalline silicon cell, a cadmium telluride thin film cell, a copper indium gallium selenium thin film cell, a silicon-based thin film solar cell, and a laminated solar cell.

After construction of the cell string 103 is completed in advance, the first surface of the cell string 103 is attached to the surface of the first adhesive film 102 away from the first cover plate 101. During attaching of the cell string 103 and the first adhesive film 102, when light-receiving surfaces of cells in the cell string 103 are all on a same side, the first surface is a surface formed by the light-receiving surface of each of the cells in the cell string 103. When the light-receiving surfaces of the cells in the cell string 103 are not all on a same side, the first surface is a surface formed by the light-receiving surface of each of most of a plurality of cells in the cell string 103 or a surface formed by the light-receiving surface of each of a plurality of cells with higher total power in the cell string 103. The light receiving surface of the cell string 103 or the surface with a larger photoelectric conversion power of the cell string 103 facing the first cover plate 101 facilitates the overall power generation of the photovoltaic curtain wall when the photovoltaic curtain wall is manufactured using a relatively thin first cover plate 101.

A second adhesive film 104 is provided, and the second adhesive film 104 is bonded to the second surface of each cell string 103.

The photovoltaic curtain wall needs to use an adhesive film as an intermediate layer to bond the cell string 103 and the cover plates on both sides of the cell string 103 respectively. Therefore, according to the strength or performance requirements of the photovoltaic curtain wall, an adhesive film of an appropriate material is selected as the second adhesive film 104. For example, the second adhesive film 104 may be an adhesive film composed of EVA, POE, or PVB, and then the second adhesive film 104 is bonded to the second surface of the cell string 103. During selecting of the first adhesive film 102 and the second adhesive film 104, films of the same material may be selected as the first adhesive film 102 and the second adhesive film 104 respectively, or films of different materials may be selected as the first adhesive film 102 and the second adhesive film 104, respectively.

A second cover plate 105 is provided, and the second cover plate 105 and a surface of the second adhesive film 104 away from the cell string 103 are bonded to each other, and a photovoltaic curtain wall is formed by performing a laminating process on the first cover plate 101, the first adhesive film 102, the cell string 103, the second adhesive film 104, and the second cover plate 105.

During manufacturing of the photovoltaic curtain wall, the first cover plate 101 and the second cover plate 105 are selected according to the strength requirement of the photovoltaic curtain wall, where a thickness of the selected second cover plate 105 is greater than or equal to an equivalent thickness, and a thickness of the first cover plate 101 is less than the thickness of the second cover plate 105. Thereafter, the selected second cover plate 105 is attached to the surface of the second adhesive film 104 away from the cell string 103 to complete the assembly of the basic structure of the photovoltaic curtain wall, and then the basic structure is processed by the laminating process to complete the preparation of the photovoltaic curtain wall. The equivalent thickness is a thickness of a target cover plate which meets a preset condition, a material of the target cover plate is the same as that of the second cover plate, and the preset condition includes that the target cover plate undergoes a preset bending deformation in response to a preset load.

That is, during manufacturing of the photovoltaic curtain wall, according to the strength requirement of the photovoltaic curtain wall, that is, a bending deformation of the photovoltaic curtain wall under the preset load is taken as the preset bending deformation, and then the thickness of the target cover plate which is made of the same material as the second cover plate 105 and undergoes the preset bending deformation in response to the preset load is taken as the equivalent thickness. During selecting of the first cover plate 101 and the second cover plate 105, the second cover plate 105 having the thickness greater than or equal to the equivalent thickness and the first cover plate 101 having the thickness smaller than the second cover plate are selected to manufacture the photovoltaic curtain wall.

According to the target strength of the photovoltaic curtain wall, the thickness of the target cover plate which have the same material as the second cover plate 105 and can independently meet the strength requirement is taken as the equivalent thickness, and the second cover plate 105 of which thickness is greater than or equal to the equivalent thickness is selected to prepare the photovoltaic curtain wall, so that the strength requirement of the photovoltaic curtain wall can be independently carried by the second cover plate 105. When the first cover plate 101 is selected, a cover plate having an thickness smaller than the second cover plate 105 can be selected as the first cover plate 101. Therefore, the thickness of the selected first cover plate 101 can be further reduced to improve the light transmittance of the first cover plate 101 and reduce the overall weight of the photovoltaic curtain wall. In addition, on the basis of ensuring the mechanical strength of the photovoltaic curtain wall, light energy received by the cell string 103 is increased, and the number of photo-generated carriers generated by the cell string 103 can be improved, such that the photoelectric conversion efficiency and power generation of the photovoltaic curtain wall can be improved.

It is to be noted that specification parameters of the photovoltaic curtain wall will be calibrated (indicated) when leaving the factory. The indicated specification parameters generally include a size, strength, power generation, and other parameters of the photovoltaic curtain wall. The preset load and the preset bending deformation belong to strength parameters of the photovoltaic curtain wall, and the preset load is the load calibrated in the specification parameters, and indicates the load used when calibrating the bending deformation of the photovoltaic curtain wall. The preset bending deformation is the bending deformation calibrated in the specification parameters, and indicates a bending deformation when the photovoltaic curtain wall bears the preset load.

In addition, during calibrating of the strength parameters of the traditional photovoltaic curtain wall, the strength of the traditional photovoltaic curtain wall is determined in a way in which the two cover plates participate in the structural calculation together. However, the photovoltaic curtain wall in the embodiment of the present disclosure is designed with the second cover plate 105 independently participating in the structural calculation and bearing load, so that the strength parameter of the photovoltaic curtain wall can be calibrated only according to the thickness of the second cover plate 105.

In addition, the second cover plate 105 may be a glass cover plate, such as tempered glass, semi-tempered glass, curved glass, plexiglass, etc. Alternatively, the second cover plate 105 may also be other cover plates of other materials and with higher strength, such as, a high-strength plastic cover plate, composite glass, and the like. The first cover plate 101 and the second cover plate 105 may include a same material or may include different materials. There is no restriction on the specific material of the first cover plate 101 and the second cover plate 105.

During preparing of the photovoltaic curtain wall, the thickness of the first cover plate 101 selected can be in a range of 1 mm to 4 mm, for example, 1.1 mm, 1.35 mm, 1.75 mm, 2.5 mm, 2.75 mm, 3 mm, 3.5 mm, or 3.8 mm, etc., so as to improve the light transmittance of the first cover plate 101 and ensure that the first cover plate 101 has sufficient protection capability. A thickness difference between the second cover plate 105 and the first cover plate 101 may be controlled in a range of 3 mm to 15 mm, for example, 3.5 mm, 3.75 mm, 4.5 mm, 5.75 mm, 6.5 mm, 7.75 mm, 9 mm, 12 mm, 13.5 mm, 14.75 mm, or the like. The specific thickness of the second cover plate 105 can be adjusted according to the scenario where the photovoltaic curtain wall is applied and the strength requirements of the photovoltaic curtain wall. For example, if the strength of the photovoltaic curtain wall is required to be not lower than the strength of the traditional photovoltaic curtain wall with cover plate thickness of 5 mm+5 mm, a second cover plate 105 with a thickness greater than or equal to 6.3 mm can be selected. If the strength of the photovoltaic curtain wall is required to be not lower than that of the traditional photovoltaic curtain wall with cover plate thickness of 6 mm+6 mm, a second cover plate 105 with a thickness greater than or equal to 7.56 mm can be selected. If the strength of the photovoltaic curtain wall is required to be not lower than that of the traditional photovoltaic curtain wall with cover plate thickness of 10 mm+10 mm, a second cover plate 105 with a thickness greater than or equal to 12.6 mm can be selected. If the strength of the photovoltaic curtain wall is required to be not lower than that of the traditional photovoltaic curtain wall with cover plate thickness of 12 mm+12 mm, a second cover plate 105 with a thickness greater than or equal to 15.12 mm can be selected.

In some embodiments, the laminating process includes laminating using a laminator and/or an autoclave.

During the laminating, a laminating method adopted in the laminating process can be selected according to the specific materials of the selected first adhesive film 102 and the second adhesive film 104. For example, if the first adhesive film 102 and the second adhesive film 104 are not PVB films, the laminating process can be directly carried out by using a laminator. In the case where at least one of the first adhesive film 102 and the second adhesive film 104 is a PVB film, the lamination process may be performed by an autoclave or the lamination process may be performed by performing first lamination using a laminator and then performing second lamination using an autoclave. By selecting different laminating methods to perform the laminating according to the material of each adhesive film, the reliability of the formed photovoltaic curtain wall may be improved.

In addition, before the laminating process, edge sealing of the basic structure of the photovoltaic curtain wall to be laminated can also be performed with high-temperature resistant tape. That is, an edge of the basic structure of the photovoltaic curtain wall is wrapped, then a laminating tooling is installed on the edge of the basic structure of the photovoltaic curtain wall, and the basic structure of the photovoltaic curtain wall with the laminating tooling is put into a laminator for laminating. A material of the laminating tooling may include epoxy resin, aluminum, high-temperature resistant resin, etc. A width of the laminating tooling can be larger than 10 mm, and a height of the laminating tooling should be greater than a total thickness of the basic structure of the photovoltaic curtain wall. For example, the height of the laminating tooling is larger than 1 mm~5 mm of the total thickness of the basic structure of the photovoltaic curtain wall.

In some embodiments, process parameters for laminating using the laminator include a laminating temperature of 120 degrees Celsius (C) to 165° C., a laminating time of 40 minutes to 120 minutes, and a laminating pressure of 0.1 standard atmosphere to 1 standard atmosphere.

During laminating using the laminator, in order to ensure the reliability of the photovoltaic curtain wall, some parameters in the laminating process need to be limited according to the specifications of the photovoltaic curtain wall. For example, if an area of the photovoltaic curtain wall is larger, and the thickness of the cover plate is larger or the thickness of the adhesive film is larger, it is necessary to set the laminating time to be relatively long to avoid the situation that the adhesive film is not melted. Similarly, if the area of the photovoltaic curtain wall is larger, and the thickness of the cover plate is larger or the thickness of the adhesive film is larger, the laminating pressure can be set to be larger and the vacuumizing time can be set to be longer in the laminating process.

Therefore, considering the specifications of the commonly used photovoltaic curtain wall, during laminating using the laminator, the laminating temperature of the laminator is set in a range of 120° C. to 165° C., for example, 125° C., 135° C., or 155° C.; the lamination time is set to 40 minutes to 120 minutes, for example, 45 minutes, 60 minutes, 75 minutes, 90 minutes, or 110 minutes; and the lamination pressure is set to 0.1 standard atmosphere to 1 standard atmosphere, for example, 0.2 standard atmosphere, 0.35 standard atmosphere, 0.5 standard atmosphere, 0.75 standard atmosphere, or 0.9 standard atmosphere, or the like.

In addition, when using the laminator to carry out the laminating process, if a single-chamber laminator is used, the laminating time needs to be set at more than 25 minutes and the vacuumizing time needs to be set at more than 15 minutes. If a double-chamber laminator is used, the vacuumizing time in each layer needs to be set at more than 10 minutes and the laminating time in each layer is not less than 15 minutes. In the laminating process, an area of an internal heating area of the laminator should be set larger than the area of the photovoltaic curtain wall module to ensure that the adhesive film can be heated and melted.

In some embodiments, process parameters for laminating using the autoclave include a laminating temperature of 120° C. to 180° C., a laminating pressure of 3 to 6 standard atmospheres, and a laminating time of 10 to 30 minutes.

Similar to the laminating process with the laminator, when using the autoclave for laminating process, some laminating parameters need to be set according to the specifications of the photovoltaic curtain wall. For example, the laminating temperature of the autoclave is set at 120° C. to 180° ° C., for example, 125° C., 135° C., 155° C., or 175° C.; the lamination time is set to 10 minutes to 30 minutes, for example, 12 minutes, 15 minutes, 20 minutes, 25 minutes, or 28 minutes; the lamination pressure is set to 3 standard atmospheres to 6 standard atmospheres, for example, 3.5 standard atmospheres, 4 standard atmospheres, 4.75 standard atmospheres, 5.25 standard atmospheres, or 5.65 standard atmospheres, or the like. According to the specifications of the photovoltaic curtain wall, the laminating parameters in the laminating process are set in a suitable size to ensure the reliability of the photovoltaic curtain wall.

Figure 4:
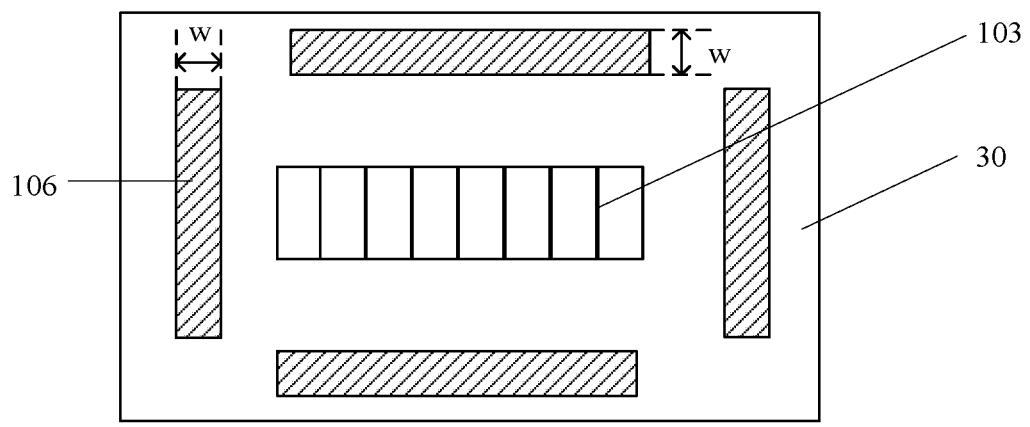
FIG. 4 is a schematic planar structural diagram of a third adhesive film according to embodiments of the present disclosure.

As illustrated in FIGS. 1 to 4, FIG. 3 is a schematic structural diagram of a photovoltaic curtain wall including a third adhesive film 106 and FIG. 4 is a schematic planar structural diagram of the third adhesive film 106. In some embodiments, the method for manufacturing the photovoltaic curtain wall further includes the following. A third adhesive film 106 is laid between the first adhesive film 102 and the second adhesive film 104, the third adhesive film 106 is facing an edge of the second cover plate 105, and the edge of the second cover plate 105 is not covered by an orthographic projection of the cell string 103 on the second cover plate 105.

During preparing of the photovoltaic curtain wall, the cell string 103 usually only shields a partial region of the photovoltaic curtain wall, that is, a projection of the cell string 103 on the first cover plate 101 and the second cover plate 105 does not completely cover the first cover plate 101 and the second cover plate 105. Since the cells contained in each of the sub-cell string (i.e., the sub-cell string 31 described below) of the cell string 103 also has a thickness, the cell string 103 may cause a cavity between the first adhesive film 102 and the second adhesive film 104, which may lead to glue shortage or bubble formation during the laminating, and further affect the bonding effect of the encapsulation film of the formed photovoltaic curtain wall on the first cover plate 101 and the second cover plate 105.

Therefore, during preparing of the photovoltaic curtain wall, a cover plate edge 30 of the cover plate which cannot be covered by the orthographic projection of the cell string 103 on the first cover plate 101 or the second cover plate 105 can be determined according to the orthographic projection of the cell string 103 on the first cover plate 101 or the second cover plate 105. Thereafter, during preparing of the photovoltaic curtain wall, the third adhesive film 106 is formed directly above the cover plate edge 30 of the cover plate, and the cavity generated by the arrangement of the cell string 103 is filled by the third adhesive film 106, so as to avoid uneven encapsulation films or even bubbles formed between the cover plates due to lack of adhesive, and improve the reliability and aesthetic degree of the manufactured photovoltaic curtain wall.

It is to be noted that for the convenience of understanding, in embodiments of the present disclosure, the third adhesive film 106 formed completely surrounds the cell string 103, and an orthographic projection of the third adhesive film 106 on the cover plate does not completely cover the cover plate edge. The cover plate edge 30 may be an edge of the first cover plate 101 or an edge of the second cover plate 105. During preparing of the third adhesive film 106, the third adhesive film 106 may include a plurality of discontinuous adhesive strips or may be a closed pattern composed of a plurality of adhesive strips. The third adhesive film 106 may completely cover the cover plate edge 30, or may only cover a partial region of the cover plate edge 30. There is no restriction on the specific preparation method of the third adhesive film 106.

In some embodiments, the third adhesive film 106 has a width greater than or equal to 10 mm.

The width of the third adhesive film 106 refers to a width w of a pattern formed by the orthographic projection of the third adhesive film 106 on the second cover plate 105. When the width of the third adhesive film 106 is too small, the amount of the adhesive film that can be supplied by the third adhesive film 106 is limited and the cavity formed between the first adhesive film 102 and the second adhesive film 104 when the cell string 103 is disposed cannot be effectively filled. Therefore, the width of the third adhesive film 106 may be set in a range of greater than or equal to 10 mm, for example, the width of the third adhesive film 106 may be set to 11 mm, 12.5 mm, 15 mm, 18 mm, 20 mm, or the like. By setting the width of the third adhesive film 106 within an appropriate range, the amount of the adhesive film that can be provided by the third adhesive film 106 is increased, and the cavity formed by arranging the cell string 103 can be effectively filled as much as possible, thereby improving the reliability of the photovoltaic curtain wall.

Referring to FIGS. 1 to 5, FIG. 5 is a schematic planar structural diagram of a fourth adhesive film 107, where Y direction in the figures is a second direction of the disclosure. In some embodiments, the cell string 103 includes a plurality of sub-cell strings 31 arranged at intervals in the second direction. The method for manufacturing the photovoltaic curtain wall further includes the following. A fourth adhesive film 107 is laid between target sub-cell strings, and the fourth adhesive film 107 is respectively bonded with the first adhesive film 102 and the second adhesive film 104. The target sub-cell strings are adjacent sub-cell strings 31 among the plurality of sub-cell strings 31, where a spacing between the target sub-cell strings in the second direction is greater than or equal to a preset value.

The spacing between the adjacent sub-cell strings 31 refers to a spacing between two edges in the middle of a pattern formed by an orthographic projection of the two adjacent sub-cell strings 31 on the cover plate. Before manufacturing of the photovoltaic curtain wall, the sub-cell strings 31 can be arranged in the second direction in advance, and then the cell string 103 can be formed by connecting the plurality of sub-cell strings 31 in series and/or in parallel. In the case that the spacing between the adjacent sub-cell strings 31 is too large in the second direction, a relatively large cavity may be formed between the first adhesive film 102 and the second adhesive film 104. During the laminating, the encapsulation film composed of the first adhesive film 102 and the second adhesive film 104 may form bubbles in or above the region where the cavity is located, which may affect the reliability and aesthetics of the photovoltaic curtain wall.

Therefore, during manufacturing of the photovoltaic curtain wall, the spacing in the second direction between adjacent sub-cell strings 31 is detected. If there are adjacent sub-cell strings 31, among the plurality of sub-cell strings 31 constituting the cell string 103, having the spacing therebetween greater than or equal to the preset value in the second direction, the adjacent sub-cell strings 31 having the spacing therebetween greater than or equal to the preset value are taken as the target sub-cell strings. The fourth adhesive film 107 is formed between the target sub-cell strings according to a position of the target sub-cell strings. By forming the fourth adhesive film 107 between the target sub-cell strings, the cavities between the sub-cell strings 31 are filled, thereby improving the quality of the encapsulation film formed after lamination and the reliability of the photovoltaic curtain wall.

The preset value for the spacing between the target sub-cell strings in the second direction may be between 5 mm and 200 mm, for example, the preset value may be 5 mm, 7.5 mm, 10 mm, 15 mm, 25 mm, 35 mm, 50 mm, 75 mm, 100 mm, 130 mm, 150 mm, 175 mm, or 190 mm, etc., which is not limited in embodiments of the present disclosure.

Figure 6:
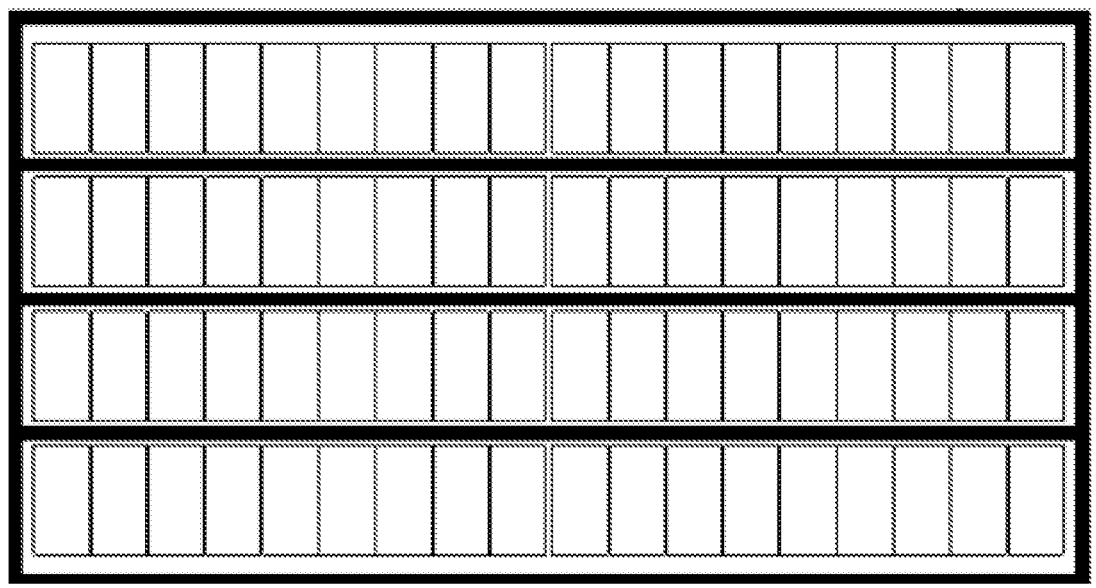
FIG. 6 is a schematic planar structural diagram of the combination of a third adhesive film and a fourth adhesive film according to embodiments of the present disclosure.
Figure 7:
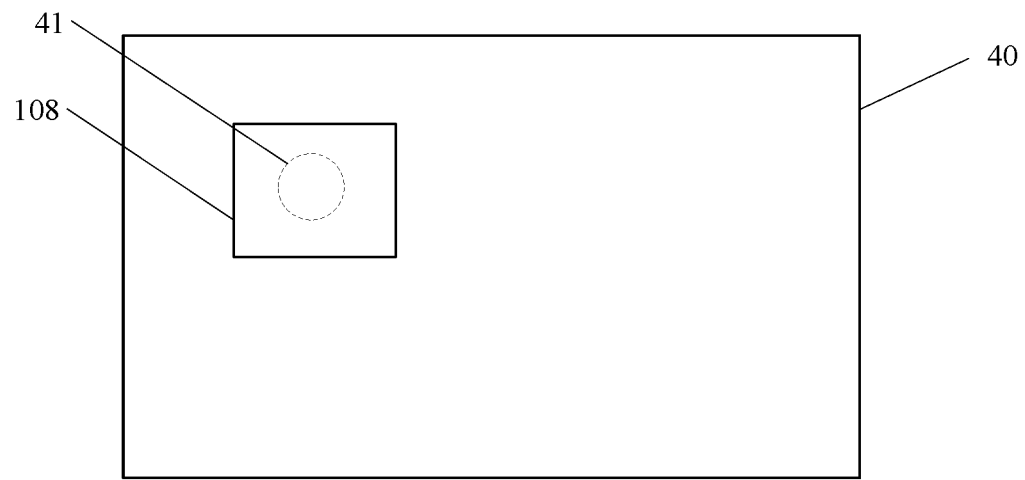
FIG. 7 is a schematic planar structural diagram of a fourth adhesive film according to embodiments of the present disclosure.
Figure 8:
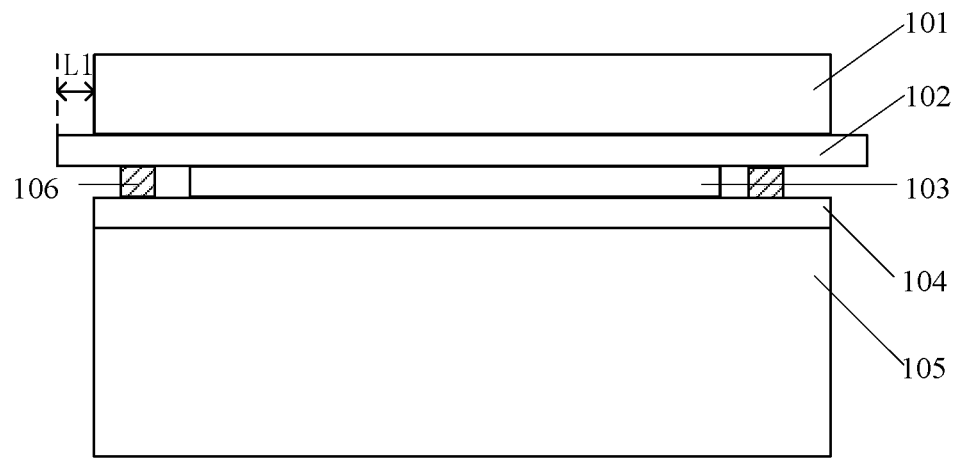
FIG. 8 is a schematic diagram of a semi-manufactured product of a photovoltaic curtain wall according to other embodiments of the present disclosure.
Figure 9:
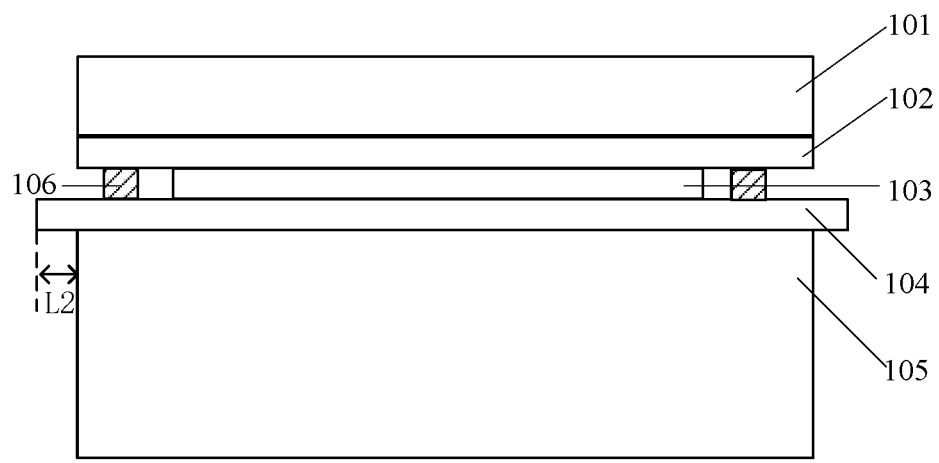
FIG. 9 is a schematic structural diagram of a semi-manufactured product of a photovoltaic curtain wall according to other embodiments of the present disclosure.

It is to be noted that for convenience of understanding, in embodiments of the present disclosure, the formed fourth adhesive film 107 failing to completely cover the region between the target sub-cell strings is taken as an example for illustration. During preparation of the fourth adhesive film 107, the fourth adhesive film 107 may completely cover the region between the target sub-cell strings, or may continue to extend outward while completely covering the region between the target sub-cell strings. FIG. 6 is a schematic structural view of the fourth adhesive film 107 combined with the third adhesive film 106, that is, the fourth adhesive film 107 extends to be in contact with the third adhesive film 106 which completely surrounds the cell string 103.

In some embodiments, the cell string 103 includes output wires, and the method for manufacturing the photovoltaic curtain wall further includes the following. At least one lead-wire opening is defined on the first cover plate 101 or the second cover plate 105, where the at least one lead-wire opening is used for leading out the output wires.

During manufacturing of the photovoltaic curtain wall, it is necessary not only to ensure the strength and reliability of the photovoltaic curtain wall, but also to ensure that the electric energy generated by the photovoltaic curtain wall can be utilized. Therefore, during preparation of the cell string 103, an output wire for outputting the electric energy generated by the cell string 103 is reserved. After the first cover plate 101 and the second cover plate 105 are selected, a target position, for leading out the output wires for outputting the electric energy generated by the cell string 103, on the first cover plate 101 or the second cover plate 105 is determined according to a preset placement position of the cell string 103 in the photovoltaic curtain wall. Thereafter, at least one hole is made at the target position on the first cover plate 101 or the second cover plate 105, and the at least one lead-wire opening for leading out the output wires are defined, and there may be one or more lead-wire openings.

It is to be noted that a shape of the lead-wire opening on the surface of the cover plate can be circular, elliptical, or polygonal. An extension direction of the lead-wire opening is preferentially perpendicular to the surface of the cover plate (i.e., the extension direction is the first direction). In order to reduce the damage of the lead-wire opening to the strength of the photovoltaic curtain wall, when the opening is round, a diameter of the opening is 5 mm to 10 mm. When the opening is polygonal, a maximum spacing between any two points of the opening on a surface of a side of the cover plate does not exceed 10 mm. In addition, during manufacturing of the lead-wire opening, the at least one lead-wire opening can be preferentially defined on the first cover plate 101, so as to avoid the influence of the at least one lead-wire opening on the strength of the photovoltaic curtain wall.

In addition, during manufacturing of the lead-wire opening, the lead-wire opening can also be directly arranged on a side surface of the photovoltaic curtain wall. That is, the lead-wire opening is formed on the exposed surface of the encapsulation film formed after laminating, and the electric energy of the photovoltaic curtain wall is output by the way of lead-wires on the side surface of the photovoltaic curtain wall. When the lead-wire opening is arranged on a side surface of the photovoltaic curtain wall, the damage of the lead-wire opening to the strength of the first cover plate 101 or the second cover plate 105 can be reduced as much as possible, and the safety of the first cover plate 101 or the second cover plate 105 can be improved.

Referring to FIGS. 1 to 4 and 7, FIG. 7 is a schematic planar structural diagram of a fifth adhesive film 108 on a third surface 40. In some embodiments, the first cover plate 101 or the second cover plate 105 includes a third surface 40 adjacent to the cell string 103. After forming the at least one lead-wire opening, the method further includes providing the fifth adhesive film 108, where an opening region 41 on the third surface 40 is within an orthographic projection of the fifth adhesive film 108 on the third surface 40.

After the lead-wire opening is formed on the first cover plate 101 or the second cover plate 105, during the laminating, the adhesive film may melt and flow. Since the lead-wire opening is a large vacancy, the melted adhesive film in a region corresponding to the lead-wire opening may flow into the lead-wire opening, thereby resulting in the decrease of the adhesive film between the first cover plate 101 and the second cover plate 105, such that glue shortage or uneven distribution in the region near the lead-wire opening may be caused, and further bubbles or glue shortage in the encapsulation film formed after laminating may be caused.

Therefore, during preparing of the photovoltaic curtain wall, the fifth adhesive film 108 may be formed in advance on the third surface 40, adjacent to the cell string 103, of the first cover plate 101 or the second cover plate 105 where the lead-wire opening is defined. The fifth adhesive film 108 is located above the opening region 41 of the third surface 40, and the orthographic projection of the fifth adhesive film 108 on the third surface 40 may completely cover the opening region 41. That is, the opening region 41 on the third surface 40 is located within the orthographic projection of the fifth adhesive film 108 on the third surface 40. The third surface 40 may be a surface of the first cover plate 101 adjacent to the cell string 103 or a surface of the second cover plate 105 adjacent to the cell string 103.

In addition, the fifth adhesive film 108 can be directly arranged between the first adhesive film 102 and the second adhesive film 104, and is directly facing the lead-wire opening. There is no restriction on the specific arrangement position of the fifth adhesive film 108, as long as the orthographic projection of the fifth adhesive film 108 on the third surface 40 can completely cover the opening region 41.

It is to be noted that during forming of the fifth adhesive film 108, it is necessary to control the thickness of the fifth adhesive film 108. If the thickness of the fifth adhesive film 108 is too large, the fifth adhesive film 108 or the adhesive film in contact with the fifth adhesive film 108 may not melt during the laminating, which may affect the reliability of the formed photovoltaic curtain wall. If the fifth adhesive film 108 is too thin, the fifth adhesive film 108 can provide a small amount of adhesive film, which may not effectively supplement the adhesive film lost through the lead-wire opening during the laminating, and has limited ability to reduce bubbles or glue shortage in the encapsulation film. Therefore, the thickness of the fifth adhesive film 108 may be set in a range of one quarter to three quarters of the thickness of the first adhesive film 102 or the second adhesive film 104 adjacent to the fifth adhesive film 108.

In addition, another factor that affects the quantity of adhesive film that the fifth adhesive film 108 can provide is an area of an orthographic projection of the fifth adhesive film 108 on the third surface 40. The area of the orthographic projection of the fifth adhesive film 108 on the third surface 40 can be set to be 1.5 times to 2.5 times of an area of the opening region 41, so as to ensure that the fifth adhesive film 108 can effectively supplement the adhesive film lost through the lead-wire opening during the laminating.

Referring to FIGS. 1 to 8, in some embodiments, the first adhesive film 102 is provided as follows. The first adhesive film 102 capable of completely covering a surface of the first cover plate 101 in contact with the first adhesive film 102 is provided, and a distance between an edge of the first adhesive film 102 and an edge of the first cover plate 101 is greater than 3 mm. That is, the first adhesive film 102 extends outward relative to the first cover plate 101 by at least 3 mm.

During forming of the photovoltaic curtain wall, the first adhesive film 102 may deform or shrink due to heat during the laminating. If the first adhesive film 102 does not cover the surface of the first cover plate 101 in contact with the first adhesive film 102 or the first adhesive film 102 just completely cover the surface of the first cover plate 101 in contact with the first adhesive film 102, the deformed or shrink first adhesive film 102 may lead to a cavity formed between the first cover plate 101 and the second cover plate 105, and the formed cavity may not be filled in the subsequent laminating process, thereby causing bubbles in the encapsulation film formed between the first cover plate 101 and the second cover plate 105, thus reducing the reliability of the photovoltaic curtain wall.

Therefore, during selecting of the first adhesive film 102, a film of which size is larger than the surface of the first cover plate 101 in contact with the first adhesive film 102 can be selected as the first adhesive film 102, and a distance between the edge of the first adhesive film 102 and the edge of the first cover plate 101 after bonding can be ensured to be greater than 3 mm. For example, the distance between the edge of the first adhesive film 102 and the edge of the first cover plate 101 is set to 3.5 mm, 5 mm, 7.5 mm, 10 mm, 12 mm, 15 mm, or the like. The distance between the edge of the first adhesive film 102 and the edge of the first cover plate 101 refers to a spacing L1 between an outermost edge of the first adhesive film 102 and an outermost edge of the first cover plate 101 in a direction parallel to a surface of the first cover plate 101 in contact with the first adhesive film 102.

Since the first adhesive film 102 can completely cover the surface where the first cover plate 101 is in contact with the first adhesive film 102 and the distance between the edge of the first adhesive film 102 and the edge of the first cover plate 101 is greater than 3 mm, the problem of glue shortage or non-uniformity of the adhesive film caused by shrinkage and deformation of the adhesive film in the laminating process is reduced as much as possible, and the quality of the formed encapsulation film and the reliability of the photovoltaic curtain wall are improved.

In some embodiments, referring to FIGS. 1 to 9, the second adhesive film 104 is provided as follows. The second adhesive film 104 capable of completely covering a surface of the second cover plate 105 in contact with the second adhesive film 104 is provided, and a spacing between an edge of the second adhesive film 104 and an edge of the second cover plate 105 is greater than 3 mm. That is, the second adhesive film 104 extends outward relative to the second cover plate 105 by at least 3 mm.

Figure 10:
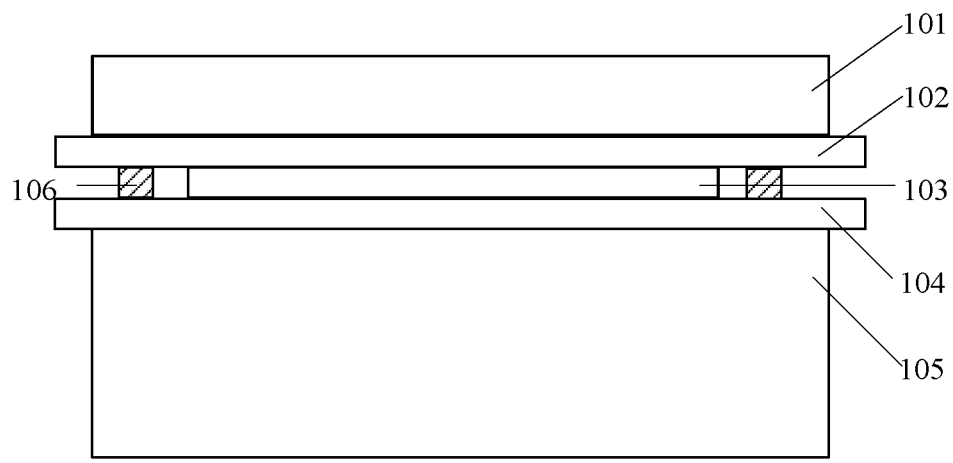
FIG. 10 is a schematic structural diagram of a semi-manufactured product of a photovoltaic curtain wall according to other embodiments of the present disclosure.

The spacing between the edge of the second adhesive film 104 and the edge of the second cover plate 105 refers to a spacing L2 between an outermost edge of the second adhesive film 104 and an outermost edge of the second cover plate 105 in a direction parallel to the surface where the second cover 105 contacts the second adhesive film 104. Similar to the first adhesive film 102, when the size of the second adhesive film 104 is relatively small, there is a high probability that bubbles exist in the encapsulation film formed between the first cover plate 101 and the second cover plate 105 after the laminating. Therefore, during providing of the second adhesive film 104, a film capable of at least completely covering the surface of the second cover plate 105 in contact with the second adhesive film 104 is selected, and the spacing between the edge of the second adhesive film 104 and the edge of the second cover plate 105 is controlled in a range of greater than 3 mm. For example, the spacing between the edge of the second adhesive film 104 and the edge of the second cover plate 105 is set to 3.5 mm, 5 mm, 7.5 mm, 10 mm, 12 mm, 15 mm, etc., so as to minimize the problem of lack of glue or non-uniformity of the glue due to shrinkage and deformation of the glue film during the laminating, and to improve the quality of the formed encapsulation film and the reliability of the photovoltaic curtain wall. Since the second adhesive film 104 is similar to the first adhesive film 102, for the details of the second adhesive film 104, reference may be made to the foregoing embodiments of the first adhesive film 102, which are not described herein. FIG. 10 is a schematic structural diagram of a photovoltaic curtain wall before laminating by simultaneously providing the first adhesive film 102 larger than the first cover plate 101 and the second adhesive film 104 larger than the second cover plate 105.

In some embodiments, the method further includes the following. At least one bypass diode is provided for the cell string 103.

During use of the photovoltaic curtain wall, some cells in the cell string 103 may be shielded. In this case, the shielded cells do not work, which may cause other cells of normally working to be unable to output electric energy, and then generate a large amount of heat, resulting in damage to the cell string 103 and even the photovoltaic curtain wall.

Therefore, before the laminating, at least one bypass diode can be provided for the cell string 103, and the bypass diode can be used as a standby power output path. Under the condition that the cells connected in parallel are shielded, the carrier transmission can be continued through the at least one bypass diode, thereby improving the safety and service life of the photovoltaic curtain wall.

The bypass diode can be connected with the cell string 103 through the lead-wire opening. The bypass diode is arranged in a photovoltaic box and the photovoltaic box can ensure the insulation and safety of the bypass diode and the output wires. Specifically, the photovoltaic box can be arranged on the back surface of the second cover plate 105 or at side corners of the photovoltaic curtain wall.

In addition, the number of bypass diodes may be set as required, the cell string 103 is divided into a plurality of cell units by the at least one bypass diode, and each of the plurality of cell units is constituted by at least one cell, and the at least one bypass diode is connected in parallel with one cell unit and in series with remaining cell units. There is no restriction on the specific number of bypass diodes provided.

Correspondingly, embodiments of the disclosure further provide a photovoltaic curtain wall, which is formed by the above-mentioned method for manufacturing the photovoltaic curtain wall. The specific structure of the photovoltaic curtain wall can be referred to FIG. 11, and the photovoltaic curtain wall includes a first cover plate 101, a cell string 103, and a second cover plate 105 that are sequentially stacked in a first direction, and an encapsulation film 1004, where the encapsulation film 1004 is positioned between the first cover plate 101 and the second cover plate 105 and wraps the cell string 103. The encapsulation film 1004 includes a first adhesive film and a second adhesive film, the first adhesive film is attached to the first cover plate 101, and the second adhesive film is attached to the second cover plate 105.

Figure 12:
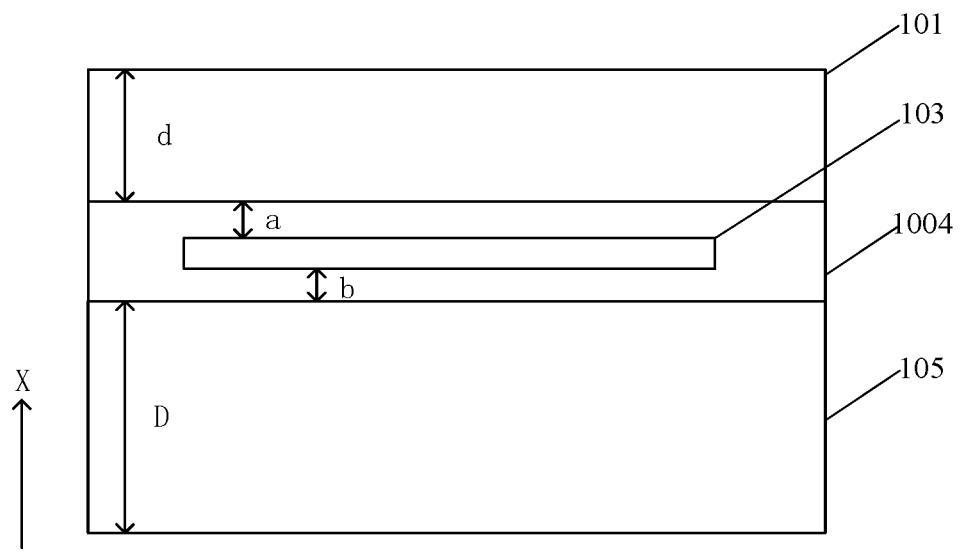
FIG. 12 is a schematic structural diagram of another photovoltaic curtain wall according to other embodiments of the present disclosure.

Further, as shown in FIG. 12, in the first direction (i.e., X direction), a thickness D of the second cover plate 103 is greater than or equal to an equivalent thickness, and a thickness d of the first cover plate 101 is smaller than the thickness D of the second cover plate 103. The equivalent thickness is a thickness of a target cover plate satisfying a preset condition. The target cover plate is made of a same material as the second cover plate 105, and the preset condition includes that the target cover plate undergoes a preset bending deformation in response to a preset load.

The photovoltaic curtain wall can be formed by sequentially stacking the first cover plate 101, the first adhesive film, the cell string 103, a second adhesive film, and the second cover plate 105 and laminating the first cover plate 101, the first adhesive film, the cell string 103, the second adhesive film, and the second cover plate 105 through a laminating process. The first adhesive film and the second adhesive film form the encapsulation film 1004 encapsulating the cell string 103 between the first cover plate 101 and the second cover plate 105 after laminating.

The thickness d of the first cover plate 101 refers to a spacing between a surface of the first cover plate 101 in contact with the encapsulation film 1004 and a surface of the first cover plate 101 away from the encapsulation film 1004 in the first direction. The thickness D of the second cover plate 105 refers to a spacing between a surface of the second cover plate 105 in contact with the encapsulation film 1004 and a surface of the second cover plate 105 away from the encapsulation film 1004 in the first direction. A spacing between the surface of the first cover plate 101 in contact with the encapsulation film 1004 and the cell string 103 refers to a distance a between the surface of the first cover plate 101 in contact with the encapsulation film 1004 and a surface (i.e., a first surface described below) of the cell string 103 facing the first cover plate 101.

In the first direction, the thickness of the first cover plate 101 is smaller than that of the second cover plate 105, and the thickness of the first cover plate 101 is in a range of 1 mm to 4 mm, and the distance between the surface of the first cover plate 101 in contact with the encapsulation film 1004 and the cell string 103 is in a range of 0.35 mm to 1.2 mm.

During selecting of the second cover plate 105, a thickness of the target cover plate, which is made of the same material as the second cover plate 105 and satisfies a preset condition, is taken as the equivalent thickness. The preset condition means that the target cover plate undergoes a preset bending deformation in response to a preset load, where the preset load and the preset bending deformation are determined according to a target strength of the photovoltaic curtain wall. Thereafter, the second cover plate 105 of which thickness is greater than or equal to the equivalent thickness is selected to prepare the photovoltaic curtain wall, so that the second cover plate 105 can independently meet the requirement that the photovoltaic curtain wall has a target strength, and ensure the mechanical strength of the photovoltaic curtain wall. During selecting of the first cover plate 101, since the second cover plate 105 can independently meet the strength requirement of the photovoltaic curtain wall, when selecting the first cover plate 101 with a thickness smaller than the second cover plate 105, the thickness of the selected first cover plate 101 can be reduced (for example, the first cover plate 101 with a thickness in the range of 1 mm to 4 mm can be selected to significantly reduce the thickness of the first cover plate 101 of the photovoltaic curtain wall having a relatively large target intensity). Therefore, the light transmittance on the side of the first cover plate 101 of the photovoltaic curtain wall is improved, the light energy received by the cell string 103 is increased, and the number of photo-generated carriers generated by the cell string 103 is increased, thereby improving the photoelectric conversion efficiency and power generation of the photovoltaic curtain wall.

It shall be understood that the specification parameters of the photovoltaic curtain wall may be calibrated when leaving the factory. The calibrated specification parameters generally include the size, strength, power generation, and other parameters of the photovoltaic curtain wall. The preset load and the preset bending deformation belong to the strength parameters of the photovoltaic curtain wall, and the preset load is the calibrated load in the specification parameters, which indicates the load used when calibrating the bending deformation of the photovoltaic curtain wall. The preset bending deformation is the bending deformation calibrated in the specification parameters, which indicates the specific size of the bending deformation when the photovoltaic curtain wall bears the preset load. During preparing of the photovoltaic curtain wall, a thickness range of the second cover plate 105 is determined according to the strength parameters in the target specification of the photovoltaic curtain wall, and then an appropriate thickness is selected to prepare the photovoltaic curtain wall to ensure that the photovoltaic curtain wall can accurately meet the strength requirements.

During strength parameter calibration of the traditional photovoltaic curtain wall, the strength of the photovoltaic curtain wall is determined according to the two cover plates participating in the structural calculation together. In embodiments of the disclosure, the photovoltaic curtain wall is designed with the second cover plate 105 independently participating in the structural calculation and bearing load, so the strength parameter calibration can be carried out only according to the thickness of the second cover plate 105.

It is to be noted that different photovoltaic curtain walls can have different specification parameters. In the photovoltaic curtain wall in the embodiment of the present disclosure, there is only a need to satisfy that the thickness d of the first cover plate 101 is less than the thickness D of the second cover plate 105, and the thickness D of the second cover plate 105 is greater than or equal to the equivalent thickness of the target cover plate that can independently meet the strength requirements. There is no restriction on the specific values of the thickness d of the first cover plate 101 and the thickness D of the second cover plate 105.

Since during preparation of the photovoltaic curtain wall, the first cover plate 101 of which thickness is smaller than the thickness of the second cover plate 105 and of which thickness is in a range of 1 mm to 4 mm is selected, the light absorption amount of the first cover plate 101 is greatly reduced, and the light transmittance of the first cover plate 101 is effectively improved. In addition, the thickness of the encapsulation film 1004, wrapping the cell string 103 in the photovoltaic curtain wall and bonding the first cover plate 101 and the second cover plate 105, between the first cover plate 101 and the cell string 103, i.e., the spacing between the surface of the first cover plate 101 in contact with the encapsulation film 1004 and the cell string 103 is set in a range of 0.35 mm to 1.2 mm, so as to ensure that the encapsulation film 1004 has good bonding effect on the first cover plate 101 and effectively control the light absorption of the encapsulation film 1004 on the incident light passing through the first cover plate 101. In combination with the improvement of the light transmittance of the first cover plate 101, the energy loss when the incident light on the first cover plate 101 passes through the first cover plate 101 and the encapsulation film 1004 to reach the cell string 103 is reduced, the light energy received by the cell string 103 is improved, the photo-generated carriers generated by the cell string 103 is increased, and the photoelectric conversion efficiency and power generation of the photovoltaic curtain wall is increased.

In addition, the first cover plate 101 may be a glass cover plate, such as, embossed glass, tempered glass, semi-tempered glass, self-cleaning glass, anti-glare glass, anti-reflection glass, plexiglass, or curved glass. The first cover plate 101 may also be a plastic cover plate, such as polyvinyl fluoride film or ethylene-tetrafluoroethylene copolymer film. The second cover plate 105 may be a glass cover plate, such as tempered glass, semi-tempered glass, curved glass, colored glazed glass, or plexiglass. Alternatively, the second cover plate 105 may also be a cover plates of other materials and with higher strength, such as high-strength plastic cover plate, composite glass, or the like. The first cover plate 101 and the second cover plate 105 may include a same material or different materials. There is no restriction on the specific material of the first cover plate 101 and the second cover plate 105.

In addition, during preparing of the photovoltaic curtain wall, if each cell of the cells in the cell string 103 is a single-sided light receiving cell, a light receiving surface of the cell string 103 may face the first cover plate 101. If each cell of the cells in the cell string 103 is a double-sided light receiving cell, a target light receiving surface of the cell string 103 with higher total power generation may face the first cover plate 101. That is, the light receiving surface of the cell string 103 may be determined according to the improvement of the photoelectric conversion efficiency of the cell string 103, thereby improving the photoelectric conversion efficiency of the photovoltaic curtain wall as much as possible.

In the photovoltaic curtain wall, the encapsulation film 1004 covering the cell string 103 between the first cover plate 101 and the second cover plate 105 is formed through laminating. During preparation of the encapsulation film 1004, an adhesive film bonded to the first cover plate 101 and an adhesive film bonded to the second cover plate 105, respectively, can be laminated to form the encapsulation film 1004. However, since the cell string 103 has a thickness and the orthographic projection of the cell string 103 on the cover plate does not completely cover the cover plate, the cell string 103 cause a cavity between the adhesive films, thereby causing problems such as uneven adhesive films, bubbles, or lack of adhesive in the formed encapsulation film 1004. The cover plate may be a first cover plate 101 or a second cover plate 105.

Referring to FIGS. 11, 12, 3, and 4, during preparation of the photovoltaic curtain wall, a third adhesive film 106 may be laid between the adhesive film bonded to the first cover plate 101 i.e., first adhesive film 102 and the adhesive film bonded to the second cover plate 105, i.e., the second adhesive film 104 and is directly facing a region of an edge of the second cover plate 105. The region of the edge of the second cover plate 105 refers to a region that is not covered by the orthographic projection of the cell string 103 on the second cover plate 105. By using the third adhesive film 106 to fill the cavity generated by arranging the cell string 103, it is possible to avoid the problem of uneven adhesive film or even bubbles in the encapsulation film 1004 formed due to lack of adhesive, and improve the reliability and aesthetic degree of the manufactured photovoltaic curtain wall.

For the sake of easy understanding, in embodiments of the present disclosure, the third adhesive film 106 formed surrounds the cell string 103, and an orthographic projection of the third adhesive film 106 on the second cover plate 105 does not completely cover the edge of the cover plate. In specific scenarios, the third adhesive film 106 can completely cover the edge of the cover plate, which is not limited in the embodiments of the present disclosure.

Furthermore, a width of the third adhesive film 106 refers to a width w of a pattern formed by the orthographic projection of the third adhesive film 106 on the second cover plate 105. The width of the third adhesive film 106 may be set in a range of greater than or equal to 10 mm, for example, the width of the third adhesive film 106 may be set to 11 mm, 12.5 mm, 15 mm, 18 mm, or 20 mm, or the like. By setting the width of the third adhesive film 106 within an appropriate range, the amount of adhesive film that can be provided by the third adhesive film 106 is increased, and the cavity formed by providing the cell string 103 can be effectively filled as much as possible, thereby improving the reliability of the photovoltaic curtain wall.

In some embodiments, a thickness difference between the first cover plate 101 and the second cover plate 105 is greater than 3 mm.

An important index of the photovoltaic curtain wall is a strength of a curtain wall module. During manufacturing of the traditional photovoltaic curtain wall, the first cover plate 101 and the second cover plate 105 jointly bear the load, and a thickness difference between the first cover plate 101 and the second cover plate 105 should not be too large to prevent the cover plate from cracking due to uneven stress. Therefore, during manufacturing of the traditional photovoltaic curtain wall, based on the target strength of the module, two layers of cover plates with the same thickness or little difference in thickness may be selected to prepare the photovoltaic curtain wall. Based on the minimum strength requirements for the photovoltaic curtain wall, cover plates each having a thickness not less than 5 mm can usually be selected for preparation of the photovoltaic curtain wall. For example, two layers of cover plates with a thickness combination of 5 mm+5 mm, 6 mm+6 mm, 8 mm+8 mm, 10 mm+10 mm, 12 mm+12 mm, or 15 mm+15 mm are selected for preparation of the photovoltaic curtain wall with the target strength. When the target strength of the photovoltaic curtain wall is large, the thickness of the selected first cover plate 101 and the thickness of the second cover plate 105 is relatively large, and the light transmittance of the first cover plate 101 and the second cover plate 105 is very low. With the increasing of the strength requirement of the photovoltaic curtain wall, the light transmittance of the cover plate gradually decreases, which leads to the decrease of the photoelectric conversion efficiency and the power generation of the photovoltaic curtain wall.

However, in the photovoltaic curtain wall preparation scheme in the embodiments of the present disclosure, the second cover plate 105 independently participates in the structural calculation to carry the load, and the first cover plate 101 does not participate in the structural calculation. Therefore, the thickness difference between the first cover plate 101 and the second cover plate 105 can be set in a range of greater than 3 mm, for example, the thickness difference can be set to be 3.5 mm, 4 mm, 5.5 mm, or 7.5 mm, etc., so that the thickness d of the first cover plate 101 is significantly reduced, and the light transmittance of the first cover plate 101 is effectively improved.

In some embodiments, the thickness difference between the first cover plate 101 and the second cover plate 105 is in a range of 3 mm to 15 mm.

Photovoltaic curtain walls need to meet different strength requirements in different scenarios. For example, thickness combinations of the first cover plate 101 and the second cover plate 105 used in the current commonly used photovoltaic curtain walls include: 5 mm+5 mm, 6 mm+6 mm, 8 mm+8 mm, 10 mm+10 mm, or 12 mm+12 mm. In order to meet the strength requirements of the photovoltaic curtain walls in application scenarios, according to the strength parameters of each photovoltaic curtain wall and a calculation formula of the equivalent thickness, the equivalent thickness of the target cover plate, with the same material as the second cover plate 105, when reaching the same strength is generally larger. Therefore, in the embodiments of the present disclosure, the thickness D of the second cover plate 105 is larger. When the thickness difference between the first cover plate 101 and the second cover plate 105 is too small, the improvement of the light transmittance of the first cover plate 101 is limited, and the photoelectric conversion efficiency and power generation of the photovoltaic curtain wall are not effectively improved. When the thickness difference between the first cover plate 101 and the second cover plate 105 is too large, the thickness d of the first cover plate 101 is too small to effectively play a protective role, and the first cover plate 101 is easy to be damaged after collision or impact by sand and stone, thus causing the damage rate of the photovoltaic curtain wall to be improved.

Therefore, during the preparation of the photovoltaic curtain wall, when selecting the first cover plate 101 and the second cover plate 105, after the thickness D of the second cover plate 105 is determined, the first cover plate 101 having a thickness difference from the second cover plate 105 in the range of 3 mm to 15 mm can be selected. For example, the first cover plate 101 with a thickness difference of 3.5 mm, 3.75 mm, 4.5 mm, 5.75 mm, 6.5 mm, 7.75 mm, 9 mm, 12 mm, 13.5 mm, or 14.75 mm from the second cover plate 105 can be selected. By keeping the thickness difference between the first cover plate 101 and the second cover plate 105 within an appropriate range, the light transmittance of the first cover plate 101 is effectively improved, and the first cover plate 101 can effectively protect the photovoltaic curtain wall when collision or sand impact occurs, thus reducing the damage probability of the photovoltaic curtain wall during use.

In some embodiments, the thickness d of the first cover plate 101 is in a range of 1 mm to 4 mm.

During manufacturing of the photovoltaic curtain wall, since the strength requirements of the photovoltaic curtain wall vary greatly in different scenarios, the thickness D of the second cover plate 105 varies greatly. The first cover plate 101 does not participate in structural calculation. The main function of the first cover plate 101 is to act as a protective layer to avoid damage to the whole structure of the cell string 103 and the photovoltaic curtain wall, and the light transmittance of the first cover plate 101 is negatively correlated with the thickness of the first cover plate 101. If the thickness d of the first cover plate 101 is too small, the light transmittance of the first cover plate 101 is obviously improved, but the protection ability of the first cover plate 101 is limited, and the safety of the cell string 103 and the photovoltaic curtain wall cannot be effectively protected. Alternatively, if the thickness d of the first cover plate 101 is too large, the protection capability of the first cover plate 101 can meet the requirements, but the light transmittance is slightly improved, so that the light energy received by the cell string 103 cannot be effectively improved, and thus the photoelectric conversion efficiency and power generation of the photovoltaic curtain wall cannot be effectively improved.

Therefore, during selecting of the first cover plate 101 for preparing the photovoltaic curtain wall, the thickness d of the selected first cover plate 101 may be set in a range of 1 mm to 4 mm, for example, the thickness d of the first cover plate 101 may be set to 1.1 mm, 1.35 mm, 1.75 mm, 2.5 mm, 2.75 mm, 3 mm, 3.5 mm, 3.8 mm, or the like. By setting the thickness d of the first cover plate 101 in an appropriate range, the problems of limited improvement of light transmittance when the first cover plate 101 is too thick and limited protection capability of the cover plate when the first cover plate 101 is too thin are avoided. While effectively improving the light transmittance of the first cover plate 101, the light absorption amount of the cell string 103, and the photoelectric conversion efficiency of the photovoltaic curtain wall, the first cover plate 101 has sufficient protection capability for the photovoltaic curtain wall and reduces the probability of damage of the photovoltaic curtain wall during use.

In some embodiments, the cell string 103 has a first surface facing the first cover plate 101 and a second surface facing the second cover plate 105. In the first direction, a spacing a between the first cover plate 101 and the first surface is in a range of 0.35 mm to 1.2 mm, and a spacing b between the second cover plate 105 and the second surface is in a range of 0.75 mm to 3 mm.

During preparing of the photovoltaic curtain wall, one of functions of the encapsulation film 1004 is to bond the cell string 103 and the first cover plate 101, and a bonding effect between the cell string 103 and the first cover plate 101 is related to the thickness and size of the first cover plate 101 and a thickness of the encapsulation film 1004 between the first cover plate 101 and the cell string 103. Another function of the encapsulation film 1004 is to bond the cell string 103 and the second cover plate 105, and a bonding effect between the cell string 103 and the second cover plate 105 is also related to the thickness and size of the second cover plate 105 and a thickness of the encapsulation film 1004 between the second cover plate 105 and the cell string 103.

The thickness of the encapsulation film 1004 between the first cover plate 101 and the cell string 103 refers to the spacing a between the first surface of the cell string 103 facing the first cover plate 101 and the surface of the first cover plate 101 in contact with the encapsulation film 1004 in the first direction. The thickness of the encapsulation film 1004 between the second cover plate 105 and the cell string 103 refers to the spacing b between the second surface of the cell string 103 facing the second cover plate 105 and the second cover plate 105 in the first direction.

Since the encapsulation film 1004 is formed by laminating the first adhesive film 102 bonded between the first cover plate 101 and the cell string 103 and the second adhesive film 104 bonded between the second cover plate 105 and the cell string 103, if the thickness of the encapsulation film 1004 between the cell string 103 and the first cover plate 101 is too large, the first adhesive film 102 may not be melted, resulting in poor bonding effect of the encapsulation film 1004 on the cell string 103 and the first cover plate 101. In addition, when the light passes through the first cover plate 101 and reaches the cell string 103, the encapsulation film 1004 absorbs excessive light energy, thereby reducing the light energy received by the cell string 103. When the thickness of the encapsulation film 1004 between the cell string 103 and the first cover plate 101 is too small, it means that the thickness of the first adhesive film 102 is also small, and problems such as lack of adhesive in some regions or generation of bubbles are prone to occur during the laminating, thereby resulting in poor bonding effect. In addition, the upper limit of the force provided by the encapsulation film 104 to prevent the first cover plate 101 from falling off is small.

Similarly, when the thickness of the encapsulation film 1004 between the cell string 103 and the second cover plate 105 is too large, the second adhesive film 104 may not be melted, resulting in poor bonding effect of the encapsulation film 1004 on the cell string 103 and the second cover plate 105. If the thickness of the encapsulation film 1004 between the cell string 103 and the second cover plate 105 is too small, it means that the thickness of the second adhesive film 104 is also small, and problems such as lack of adhesive in some regions or generation of bubbles are likely to occur during the laminating, which may also lead to poor bonding effect.

Therefore, during manufacturing of the photovoltaic curtain wall, the thickness of the encapsulation film 1004 between the first cover plate 101 and the cell string 103, that is, the spacing a between the first cover plate 101 and the first surface of the cell string 103 in the first direction, can be set to 0.35 mm to 1.2 mm. For example, the thickness of the encapsulation film 1004 between the first cover plate 101 and the cell string 103 can be set to 0.36 mm, 0.38 mm, 0.55 mm, 0.75 mm, 0.76 mm, 0.88 mm, 1.1 mm, 1.14 mm, or 1.18 mm, etc. The thickness of the encapsulation film 1004 between the second cover plate 105 and the cell string 103, that is, the spacing b between the second cover plate 105 and the second surface of the cell string 103 in the first direction, may also be set to 0.75 mm to 3 mm. For example, the thickness of the encapsulation film 1004 between the second cover plate 105 and the cell string 103 may be set to 0.76 mm, 0.85 mm, 0.95 mm, 1.13 mm, 1.14 mm, 1.25 mm, 1.5 mm, 1.52 mm, 1.8 mm, 1.9 mm, 2.26 mm, 2.28 mm, 2.5 mm, 2.88 mm, or 2.9 mm, etc.

By setting the thickness of the encapsulation film 1004 between the first cover plate 101 and the cell string 103 and the thickness of the encapsulation film 1004 between the second cover plate 105 and the cell string 103 in an appropriate range, the encapsulation film 1004 has a good bonding effect on the first cover plate 101 and the second cover plate 105. In this way, it is possible to reduce the failure rate of the photovoltaic curtain wall, reduce the energy absorption of the encapsulation film 1004 on light rays passing through the first cover plate 101 and the second cover plate 105 as much as possible, improve the light energy received by the cell string 103, and further improve the photoelectric conversion efficiency and reliability of the photovoltaic curtain wall.

It is to be noted that the quality of the encapsulation film 1004, that is, the fusion effect of the two adhesive films, is related to the thickness and size of the first cover plate 101 and the thickness of the encapsulation film 1004 between the first cover plate 101 and the cell string 103. Based on the mechanism of the laminating process, during setting of the first adhesive film 102, the first adhesive film 102 (i.e., the thickness of the encapsulation film 1004 between the cell string 102 and the first cover plate 101) can be selected according to the thickness d of the first cover plate 101 and a size of the first cover plate 101. During setting of the second adhesive film 104, the second adhesive film 104 can be selected according to the thickness D of the second cover plate 105 and a size of the second cover plate 105. The size of the first cover plate 101 or second cover plate 105 refers to a width of the cover plate itself when the surface of the first cover plate 101 or the second cover plate 105 in contact with the encapsulation film 1004 is rectangular, and refers to a diameter of the cover plate itself when the surface of the first cover plate 101 or the second cover plate 105 in contact with the encapsulation film 1004 is circular.

For example, based on the mechanism of the lamination process, the thickness of the encapsulation film 1004 between the cell string 103 and the first cover plate 101 is positively correlated with the thickness and size of the first cover plate 101. The size of the first cover plate 101 is related to a shape of the surface of the first cover plate 101 in contact with the encapsulation film 1004. In the case where the surface of the first cover plate 101 in contact with the encapsulation film 1004 is rectangular, the size of the first cover plate 101 refers to the width of the first cover plate 101 itself. In the case where the surface of the first cover plate 101 in contact with the encapsulation film 104 is circular, the size of the first cover plate 101 refers to the diameter of the first cover plate 101 itself. In the case where the surface of the first cover plate 101 in contact with the encapsulation film 1004 is irregular, the size of the first cover plate 101 refers to a maximum value of spacings between any two points on the surface of the first cover plate 101 in contact with the encapsulation film 104.

When the thickness and size of the first cover plate 101 are both small, the thickness of the encapsulation film 1004 between the first cover plate 101 and the cell string 103 can also be set to be small, thereby increasing the light energy received by the cell string 103 as much as possible. When the thickness and/or size of the first cover plate 101 is large, the thickness of the encapsulation film 1004 between the first cover plate 101 and the cell string 103 can be correspondingly increased, thereby improving the light energy received by the cell string 103 and ensuring the mechanical strength of the photovoltaic curtain wall.

In some embodiments, when the thickness of the first cover plate 101 is less than or equal to 2 mm, a thickness of the encapsulation film 1004 between the first cover plate 101 and the cell string 103 is in a range of 0.3 mm to 1.2 mm.

When the thickness of the first cover plate 101 is less than or equal to 2 mm, the thickness of the encapsulation film 1004 between the first cover plate 101 and the cell string 103 is required to be low, so that the thickness of the encapsulation film 1004 between the first cover plate 101 and the cell string 103 can be set in a range of 0.3 mm to 1.2 mm, for example, 0.35 mm. 0.36 mm, 0.5 mm, 0.65 mm, 0.75 mm, 0.76 mm, 0.9 mm, 1.1 mm, 1.14 mm, 1.16 mm, etc. The thickness of the encapsulation film 1004 between the first cover plate 101 and the cell string 103 may be selected according to the specific size of the first cover plate 101, which is not limited in the embodiments of the present disclosure.

In some embodiments, when the thickness of the first cover plate 101 is greater than 2 mm and less than or equal to 4 mm, the thickness of the encapsulation film 1004 between the first cover plate 101 and the cell string 103 is 0.75 mm to 1.2 mm.

In a case where the thickness of the first cover plate 101 is greater than 2 mm, the first cover plate 101 has a higher requirement on the thickness of the encapsulation film 1004 between the first cover plate 101 and the cell string 103, thereby ensuring the bonding effect of the encapsulation film 1004 on the first cover plate 101. Therefore, the thickness of the encapsulation film 1004 between the first cover plate 101 and the cell string 103 may be set in a range of 0.75 mm to 1.2 mm, for example, 0.75 mm, 0.76 mm, 0.9 mm, 1.1 mm, 1.14 mm or 1.16 mm. The thickness of the encapsulation film 1004 between the first cover plate 101 and the cell string 103 may be selected according to the specific size of the first cover plate 101, which is not limited in embodiments of the present disclosure.

Since the thickness of the commonly used adhesive film is generally an integral multiple of 0.38 mm, the thickness of the first adhesive film 102 forming the encapsulation film 1004 can be set according to the thickness and size of the first cover plate 101 as illustrated in Table 1.

TABLE 1

| | Thickness of the first adhesive film | | |
|---|---|---|---|
| Thickness d of the first cover plate | cover plate size ≤ 800 mm | 800 mm < cover plate size ≤ 1500 mm | cover plate size > 1500 mm |
| 2.0 mm ≥ d | 0.38 mm | 0.76 mm | 1.14 mm |
| 4 mm ≥ d > 2.0 mm | 0.76 mm | 0.76 mm | 1.14 mm |

Since the encapsulation film 1004 is formed through laminating, the first adhesive film 102 and the second adhesive film 104 melt and flow during the laminating, the thickness of the encapsulation film 1004 between the first cover plate 101 and the cell string 103 changes slightly in the vicinity of the original thickness of the first adhesive film 102 due to the flow of the adhesive film. In embodiments of the disclosure, the encapsulation film 1004 may be prepared by using the first adhesive film 102 of other thickness.

The thickness of the encapsulation film 1004 between the second cover plate 105 and the cell string 103 refers to the spacing b between a surface of the cell string 103 facing the second cover plate 105 and a surface of the second cover plate 105 in contact with the encapsulation film 1004 in the first direction. One of functions of the encapsulation film 1004 is to bond the second cover plate 105. For similar reasons, when the thickness of the encapsulation film 1004 between the cell string 103 and the second cover plate 105 is too large, there may be a case where the bonding effect of the second cover plate 105 is poor and the light energy acquired by the cell string 103 is reduced. If the thickness of the encapsulation film 1004 between the cell string 103 and the second cover plate 105 is too small, the bonding effect is not good and the safety of the photovoltaic curtain wall is reduced.

Therefore, in order to reduce the influence on the light energy received by the cell string 103 while ensuring the bonding effect on the second cover plate 105 and the safety of the photovoltaic curtain wall, the thickness of the encapsulation film 1004 between the cell string 103 and the second cover plate 105 may be provided according to the thickness and the size of the second cover plate 105. For the description of size of the second cover plate 105, reference may be made to the description of the size of the first cover plate 101, which is not described herein.

In some embodiments, the encapsulation film 1004 between the second cover plate 105 and the cell string 103 has a thickness in a range of 0.75 mm to 3 mm.

The thickness of the encapsulation film 1004 between the second cover plate 105 and the cell string 103 needs to be set according to the thickness and size of the second cover plate 105. The commonly used thickness combinations of cover plates of the photovoltaic curtain wall include 5 mm+5 mm, 6 mm+6 mm, 8 mm+8 mm, 10 mm+10 mm, 12 mm+12 mm, and 15 mm+15 mm. Therefore, the thickness of the encapsulation film 1004 between the second cover plate 105 and the cell string 103 is required to be high during setting of the second cover plate 105, and the thickness of the encapsulation film 1004 between the second cover plate 105 and the cell string 103 may be set in the range of 0.75 mm to 3 mm, for example, 0.76 mm, 0.85 mm, 0.95 mm, 1.13 mm, 1.14 mm, 1.25 mm, 1.5 mm, 1.52 mm, 1.8 mm, 1.9 mm, 2.26 mm. 2.28 mm, 2.5 mm, 2.88 mm, or 2.9 mm. By setting the thickness of the encapsulation film 1004 between the second cover plate 105 and the cell string 103 in a suitable range, the encapsulation film 1004 has a good bonding effect on the second cover plate 105 and the cell string 103, thereby reducing the failure rate of the photovoltaic curtain wall, reducing the light absorption of the encapsulation film 1004, and increasing the light energy received by the cell string 103.

In some embodiments, the thickness of the encapsulation film 1004 between the second cover plate 105 and the cell string 103 is in a range of 0.7 mm to 1.6 mm in cases where the thickness of the second cover plate 105 is less than or equal to 6 mm.

When the thickness of the cover plate is greater than 4 mm, the bonding requirements of the cover plates with different thicknesses vary according to a gradient interval. When the thickness of the second cover plate 105 is less than or equal to 6 mm, the second cover plate 105 has relatively low requirements on the thickness of the encapsulation film 1004 between the second cover plate 105 and the cell string 103, and the thickness of the encapsulation film 1004 between the second cover plate 105 and the cell string 103 may be set in a range of 0.7 mm to 1.6 mm, for example, 0.75 mm, 0.76 mm, 0.85 mm, 0.95 mm, 1.1 mm, 1.14 mm, 1.25 mm, 1.35 mm, 1.48 mm, 1.52 mm, or 1.55 mm. The thickness of the encapsulation film 1004 between the second cover plate 105 and the cell string 103 may be selected according to the specific size of the second cover plate 105, which is not limited in the embodiments of the present disclosure.

In some embodiments, the thickness of the encapsulation film 1004 between the second cover plate 105 and the cell string 103 is in a range of 1.1 mm to 1.6 mm in cases where the thickness of the second cover plate 105 is greater than 8 mm and less than or equal to 12 mm.

When the thickness of the second cover plate 105 is in the range of 8 mm to 12 mm, the second cover plate 105 has a relatively stable requirement for the thickness of the encapsulation film 1004 between the second cover plate 105 and the cell string 103, and the thickness of the encapsulation film 1004 between the second cover plate 105 and the cell string 103 may be set in the range of 1.1 mm to 1.6 mm, for example, 1.14 mm, 1.25 mm, 1.35 mm, 1.48 mm, 1.52 mm, or 1.55 mm. The thickness of the encapsulation film 1004 between the second cover plate 105 and the cell string 103 may be selected according to the specific size of the second cover plate 105, which is not limited in the embodiment of the present disclosure.

In some embodiments, when the thickness of the second cover plate 105 is greater than or equal to 15 mm, the thickness of the encapsulation film 1004 between the second cover plate 105 and the cell string 103 is in a range of 1.5 mm to 3 mm.

When the thickness of the second cover plate 105 is greater than 15 mm, the second cover plate 105 has a high requirement for the thickness of the encapsulation film 1004 between the second cover plate 105 and the cell string 103, and the thickness of the encapsulation film 1004 between the second cover plate 105 and the cell string 103 may be set in a range of 1.5 mm to 3 mm, for example, 1.52 mm, 1.55 mm, 1.75 mm, 2.0 mm, 2.18 mm, 2.35 mm, 2.55 mm, 2.88 mm, or 2.92 mm, etc. The thickness of the encapsulation film 1004 between the second cover plate 105 and the cell string 103 may be selected according to the specific size of the second cover plate 105, which is not limited in the embodiment of the present disclosure.

Since the thickness of the commonly used adhesive film is generally an integral multiple of 0.38 mm, the thickness of the second adhesive film 104 forming the encapsulation film 1004 can be set according to the thickness and size of the second cover plate 105 as illustrated in Table 2.

TABLE 2

| | Thickness of second adhesive film | | |
|---|---|---|---|
| Thickness D of the second cover plate | cover plate size ≤ 800 mm | 800 mm < cover plate size ≤ 1500 mm | cover plate size > 1500 mm |
| 6.0 mm ≥ D | 0.76 mm | 1.14 mm | 1.52 mm |
| 12 mm ≥ D ≥ 8 mm | 1.14 mm | 1.52 mm | 1.52 mm |
| D ≥ 15 mm | 1.52 mm | 2.88 mm | 2.88 mm |

Since the encapsulation film 1004 is formed by laminating the first adhesive film 102 and the second adhesive film 104, the first adhesive film 102 and the second adhesive film 104 may melt and flow during the laminating, the thickness of the encapsulation film 1004 between the first cover plate 101 and the cell string 103 and the thickness of the encapsulation film 1004 between the second cover plate 105 and the cell string 103 may vary slightly in the vicinity of the original thickness of the first encapsulation film 102 and the original thickness of the second encapsulation film 104 as the film flows. In addition, the first encapsulation film 102 and/or the second encapsulation film 104 of other thicknesses may be used for the preparation of the encapsulation film 1004.

Figure 13:
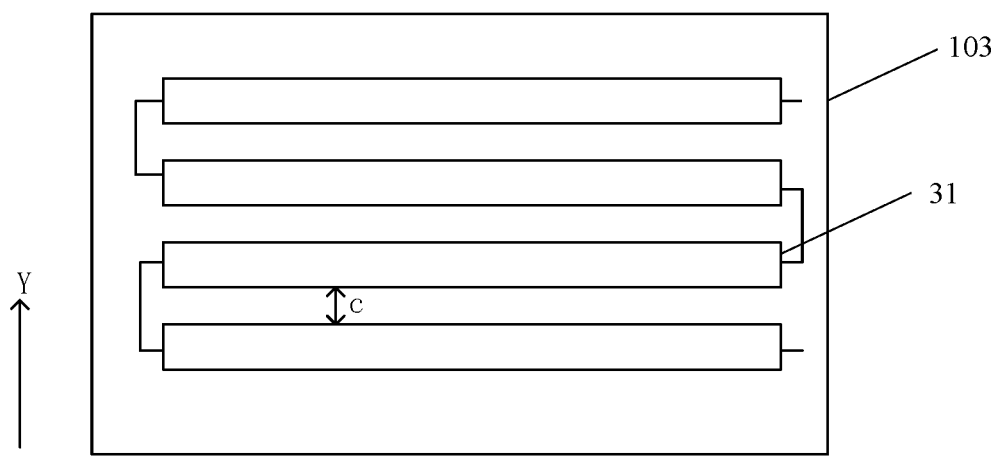
FIG. 13 is a schematic structural diagram of a cell string according to embodiments of the present disclosure.

Referring to FIGS. 12 to 13, in some embodiments, the cell string 103 includes a plurality of sub-cell strings 31 spaced apart from each other in a second direction (Y direction illustrated in the figures). In the second direction, a spacing c between any two adjacent sub-cell strings 31 of the plurality of sub-cell strings 31 is in a range of 3 mm to 200 mm. FIG. 13 is a schematic structural diagram of the cell string 103, where the Y direction is the second direction.

In the second direction, the spacing between two adjacent sub-cell strings 31 refers to the spacing c in the second direction between a side of one sub-cell string 31 of two adjacent sub-cell strings 31 facing the other sub-cell string 31 of the two adjacent sub-cell strings 31 and a side of the other sub-cell string 31 facing the one sub-cell string 31. During preparation of the photovoltaic curtain wall, the cell string 103 in the photovoltaic curtain wall may include a plurality of sub-cell strings 31 arranged at intervals in the second direction, and the power generation power provided by a single cell string 103 is relatively low, so the power generation power of the photovoltaic curtain wall is improved by using a plurality of sub-cell strings 31 connected in series. During setting of the cell string 103, if the spacing between adjacent sub-cell strings 31 is relatively small in the second direction, the light transmittance in the region where the cell string 103 is located in the photovoltaic curtain wall is very low, which leads to obvious brightness difference between the region where the cell string 103 is located and other regions, affecting the use experience of users. If the spacing between adjacent sub-cell strings 31 is too large, the number of sub-cell strings 31 constituting the cell string 103 is small due to the size of the photovoltaic curtain wall itself, and the power generated by the cell string 103 is limited.

Therefore, during setting of the cell string 103, the spacing between the adjacent sub-cell strings 31 is set between 3 mm and 200 mm in the second direction. For example, the spacing between the adjacent sub-cell strings 31 is set to 4 mm, 5 mm, 7.5 mm, 15 mm, 30 mm, 50 mm, 75 mm, 110 mm, 145 mm, 175 mm, 190 mm, or the like. By setting the spacing between the adjacent sub-cell strings 31 to an appropriate value in the second direction, the light transmission uniformity of the photovoltaic curtain wall is improved, and the brightness difference between different regions of the photovoltaic curtain wall is prevented from being too obvious due to the tight arrangement of the sub-cell strings 31, which affects the user experience. In addition, the number of sub-cell strings 31 that can be included in the cell string 103 is increased as much as possible, so that the power generation power of the cell string 103 and the photovoltaic curtain wall is effectively improved.

Furthermore, the spacing between each two adjacent sub-cell strings 31 included in the cell string 103 in the second direction may be the same or different, which is not limited in the embodiment of the present disclosure.

Figure 5:
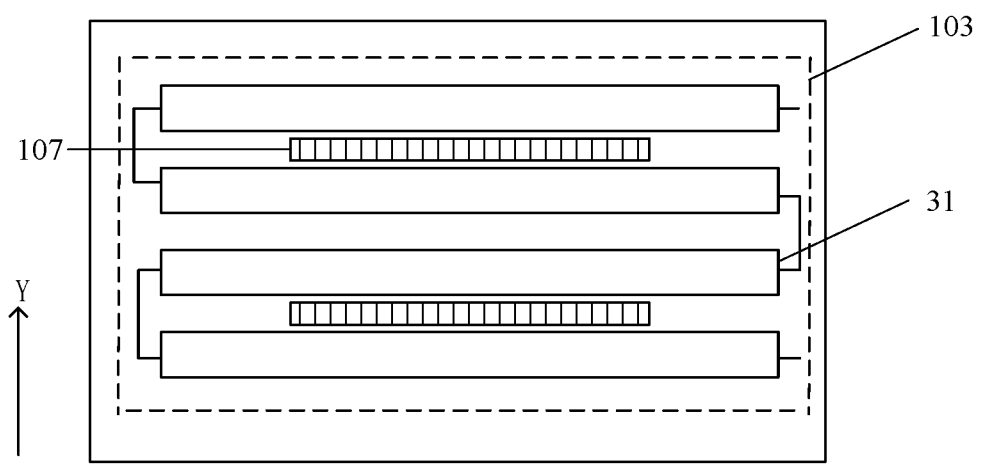
FIG. 5 is a schematic planar structural diagram of a fourth adhesive film according to embodiments of the present disclosure.
Figure 11:
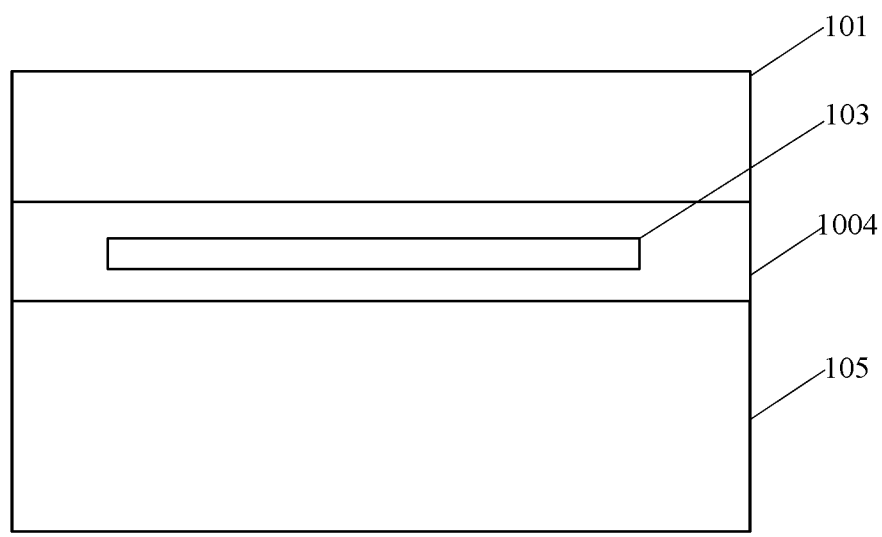
FIG. 11 is a schematic structural diagram of a photovoltaic curtain wall according to embodiments of the present disclosure.

Referring to FIG. 11, FIG. 12, and FIG. 5, when the spacing between adjacent sub-cell strings 31 is too large in the second direction, a cavity with a large volume is formed between the first adhesive film 102 and the second adhesive film 104, resulting in problems such as uneven film or bubbles in the formed encapsulation film 1004. FIG. 5 is a schematic planar structural view of the fourth adhesive film 107.

The spacing between adjacent sub-cell strings 31 refers to a spacing between two edges in the middle of a pattern formed by an orthographic projection of each of two adjacent sub-cell strings 31 on the cover plate. During fabricating of the photovoltaic curtain wall, two adjacent sub-cell strings 31 having a spacing therebetween that is greater than a preset value may be used as target sub-cell strings, and a fourth adhesive film 107 is laid between the target sub-cell strings. The fourth adhesive film 107 is used to fill a cavity between the target sub-cell strings, thereby improving the quality of the formed encapsulation film 1004.

The preset value for the spacing between the adjacent sub-cell strings 31 can be in a range of 5 mm and 200 mm, for example, the preset value can be 5 mm, 7.5 mm, 10 mm, 15 mm, 25 mm, 35 mm, 50 mm, 75 mm, 100 mm, 130 mm, 150 mm, 175 mm, or 190 mm, etc. In addition, in order to facilitate the understanding of the embodiment of the present disclosure, the fourth adhesive film 107 may not completely cover the region between the target sub-cell strings. However, the fourth adhesive film 107 may also completely cover the region between the target sub-cell strings, or even continue to extend outward to contact with the third adhesive film 106. Reference is made to FIG. 6 for a schematic diagram of the structure of a closed film region formed by the fourth adhesive film 107 in contact with the third adhesive film 106.

Figure 14:
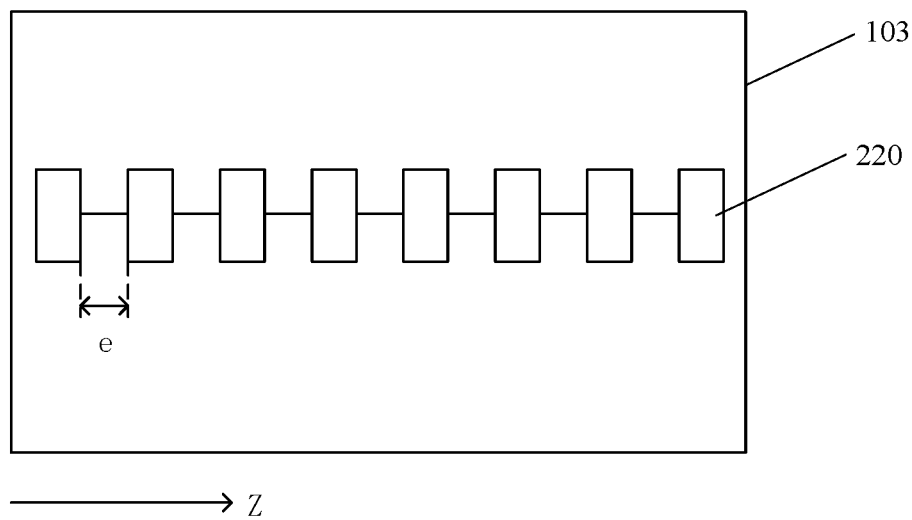
FIG. 14 is a schematic structural diagram of a cell string according to other embodiments of the present disclosure.
Figure 15:
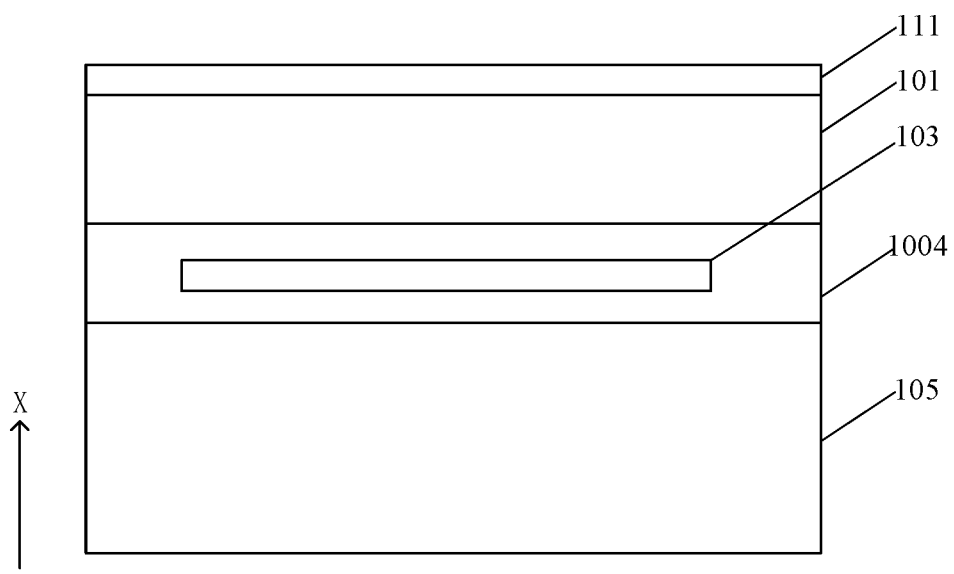
FIG. 15 is a schematic structural diagram of a photovoltaic curtain wall according to other embodiments of the present disclosure.
Figure 16:
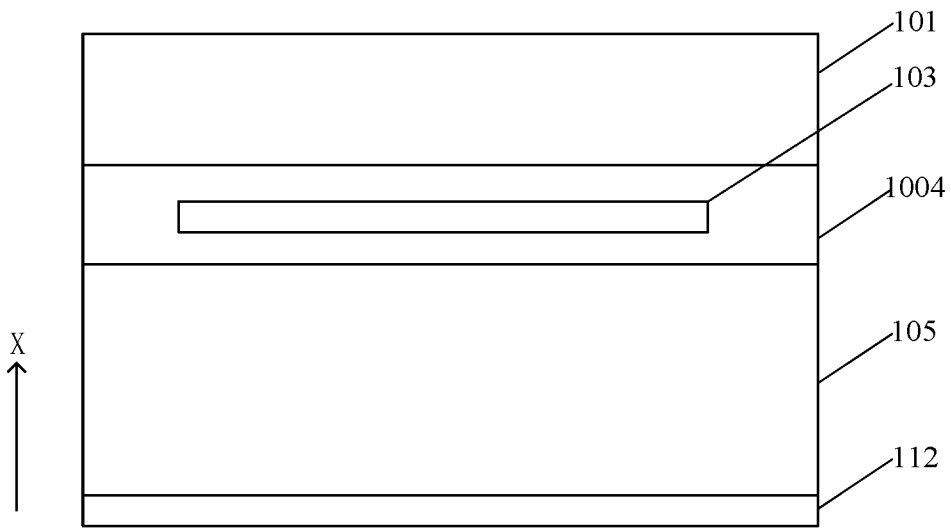
FIG. 16 is a schematic structural diagram of a photovoltaic curtain wall according to other embodiments of the present disclosure.
Figure 17:
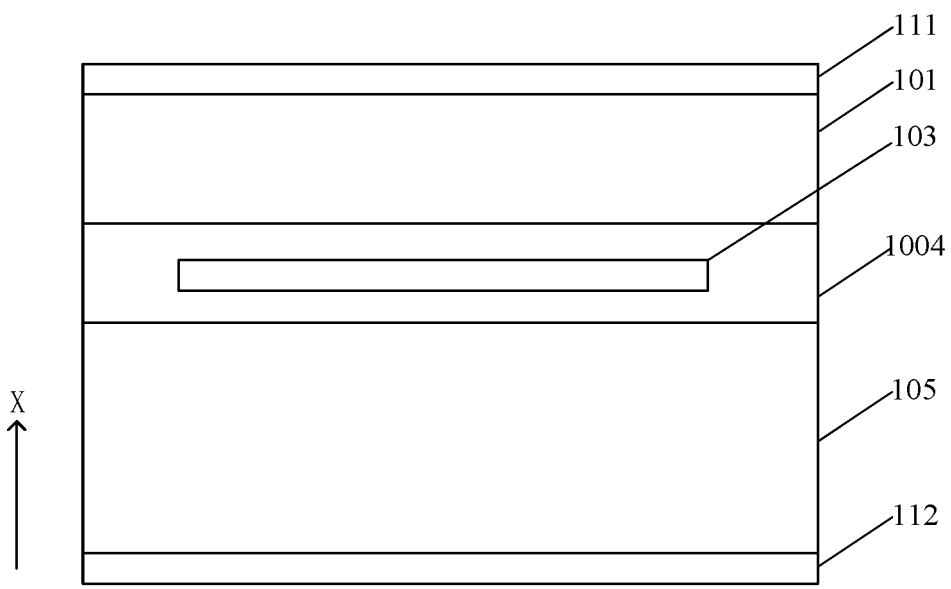
FIG. 17 is a schematic structural diagram of a photovoltaic curtain wall according to other embodiments of the present disclosure.

Referring to FIGS. 11 to 14, in some embodiments, each sub-cell string 31 includes a plurality of cells 220 arranged in a third direction. In the third direction, a spacing between any two adjacent cells 220 of the plurality of cells 220 is in a range of −1.5 mm to 200 mm. FIG. 14 is a schematic structural diagram of the cells in each sub-cell string of the cell string 103, where the Z direction is the third direction.

In the third direction, the spacing between adjacent cells 220 refers to a spacing e between two opposite sides (i.e., a side of one cell of the two adjacent cells 220 facing the other of the two adjacent cells 220 and a side of the other of the two adjacent cells 220 facing the one cell) of two adjacent cells 220 in the third direction. During constructing of the cell string 103, each cell 103 may be formed by welding a plurality of cells 220 in series. That is, the whole cell is divided into at least one slice cell in the form of full-slice, half-cut, or multiple slices, and each slice cell is served as an independent cell 220. Thereafter, the cells 220 are arranged one by one in the third direction and the cells 220 are welded together by series welding to complete the construction of the sub-cell string 31. During constructing of the sub-cell string 31 of the cell string 103, if the spacing between the adjacent cells 220 is too small in the third direction, shielding easily occurs between the adjacent cells 220, thereby causing the light absorption capacity and the power generated by the shielded cells 220 to decrease, thereby causing the overall power generated by the cell string 103 to decrease. If the spacing between adjacent cells 220 is too large, limited by the size of photovoltaic curtain walls, the number of cells 220 that can be contained in each sub-cell string 31 in the cell string 103 decreases with the increase of the spacing between adjacent cells 220, resulting in a small number of cells that can be contained in the cell string 103, thereby resulting in a low power generation of the cell string 103.

Therefore, during manufacturing of the cell string 103, when the cells 220 are arranged in the third direction, the spacing between adjacent cells 220 may be set to −1.5 mm to 200 mm, for example, −1.3 mm, −1 mm, −0.75 mm, 0 mm, 2 mm, 5 mm, 10 mm, 17.5 mm, 30 mm, 55 mm, 80 mm, 110 mm, 145 mm, 175 mm, 190 mm, etc. By setting the spacing between two adjacent cells 220 among the plurality of cells 220 constituting the cell string 103 at an appropriate size in the third direction, the power generated by the cell string 103 is increased, and reduction of the power generated by the shielded cells 220 and the overall power generated by the cell string 103 due to shielding between the adjacent cells 220 caused by too close distance between the adjacent cells 220 can be avoided. Therefore, the output upper limit of the cell string 103 is increased, and the number of cells 220 included in the cell string 103 and the maximum power generated by the cell string 103 are prevented from falling due to too large spacing between the adjacent cells 220.

Furthermore, the spacing between each cell 220 and an adjacent cell 220 included in the cell string 103 in the third direction may be the same or different, which is not limited in the embodiments of the present disclosure.

It is to be noted that in the third direction, the spacing between two adjacent sub-cells 220 is less than 0 mm, which means that tiling ribbon (TR) technology is adopted between the two adjacent sub-cells 220. That is, the two cells 220 are partially overlapped and then welded in an overlapping region. Since the edge portion of the cell 220 has poor carrier collection and transport capability, the number of cells 220 included in the cell string 103 per unit length can be increased by overlapping and welding edge regions of a plurality of cells 220, or the length of the cell string 103 in the third direction can be reduced when the number of cells 220 included is the same, thereby improving the energy density of electricity generated by the cell string 103. That is, the energy density of electricity generated by the cell strings 103 per unit length is increased by the TR technology, thereby further increasing the power generated by the photovoltaic curtain wall, and reducing the required area of the cell strings 103 in the photovoltaic curtain wall under the same power, thus improving the light transmittance of the photovoltaic curtain wall.

In addition, during constructing of the cell string 103 using the cells 220, a cell 220 having a length or width in a range of 125 mm to 220 mm may be selected. For example, a cell 220 having a length in a third direction of 125 mm, 156 mm, 158.75 mm, 166 mm, 182 mm, or 202 mm may be selected. Alternatively, a cell 220 having a width in a direction perpendicular to the third direction (i.e., in a length direction of the cell) of 125 mm, 156 mm, 158.75 mm, 166 mm, 182 mm, or 202 mm may be selected. By constructing the cell string 103 using a standard size cell 220 having low loss and high availability, the power and photoelectric conversion efficiency of the cell string 103 can be improved as much as possible.

In some embodiments, the cell 220 included in the cell string 103 include a crystalline silicon cell, a cadmium telluride thin film cell, a copper indium gallium selenium thin film cell, a silicon-based thin film solar cell, or a laminated solar cell.

In addition, during constructing of the cell string, different cells 220 may be selected to construct the cell string 103 according to the requirements on the thickness and power of the photovoltaic curtain wall. For example, under the requirement of balancing the power and thickness of photovoltaic curtain wall, the crystalline silicon solar cell may be preferentially selected to construct the cell string 103, and the crystalline silicon solar cell may be a monocrystalline silicon cell or a polycrystalline silicon cell. If the thickness of the photovoltaic curtain wall is required to be as small as possible, a thin film solar cell may be selected for the construction of the cell string 103, and the thin film solar cell may be a cadmium telluride thin film cell, a copper indium gallium selenium thin film cell, a silicon-based thin film solar cell, a perovskite thin film solar cell, and the like. In a case where the power of the photovoltaic curtain wall is required to be as large as possible, a laminated solar cell or a crystalline silicon cell or a laminated cell receiving light on both sides can be selected. Therefore, the cell 220 that constructs the cell string 103 may be any combination of one or more of a crystalline silicon cell, a cadmium telluride thin film cell, a copper indium gallium selenium thin film cell, a silicon-based thin film solar cell, and a laminated solar cell, which is not limited in the embodiments of the present disclosure.

In some embodiments, each cell 220 includes a plurality of main bus bars spaced apart from each other, where with the number of the main bus bars is 2 to 20.

The plurality of main bus bars provided on the cell 220 are intended to collect the carriers generated by the cell 220 by using the main bus bars, and the number of the main bus bars may affect the carrier collection ability and photoelectric conversion efficiency of the cell 220. When the number of main bus bars arranged on the cell 220 is too large, the main bus bars may block the light irradiated on the surface of the cell 220, which may lead to the decline of the light absorption capacity of the cell 220, and then affect the photoelectric conversion efficiency of the cell 220. When the number of main bus bars provided on the cell 220 is too small, the carrier collection ability of the cell 220 is poor, and the photo-generated carriers cannot be effectively collected, resulting in a decrease in the photoelectric conversion efficiency of the cell 220.

Therefore, during setting of the cell 220, the number of main bus bars on the surface of the cell 220 is set in a range of 2 to 20, for example, the number of main bus bars is set to be 3, 5, 7, 8, 10, 12, 15, 18, 19, etc. By setting the number of main bus bars in a suitable range, the light absorption capacity of the cell 220 is improved, the influence of the setting of main bus bars on the light absorption area of the cell 220 when the number of main bus bars is too large is avoided, and the photoelectric conversion efficiency of the cell 220 is also improved, so that reduction of the carrier collection capacity of the cell 220 is avoided when the number of main bus bars is too small.

In addition, the number of main bus bars may be set according to the size of the surface of the cell 220 on which the main bus bars are provided. For example, when the size of the surface on which the main bus bars are located is about 180 mm×31 mm, 12 main bus bars may be alternately provided for carrier collection. When the size of the surface on which the main bus bars are located is about 31 mm×240 mm, 18 main bus bars may be alternately provided for carrier collection, etc. According to the size of the substrate of the cell, setting a suitable number of main bus bars can improve the carrier collection ability and photoelectric conversion efficiency of the cell 220, and can ensure the electrical isolation degree between the main bus bars with different polarities.

Referring to FIGS. 12 to 15, in some embodiments, the photovoltaic curtain wall further includes a first functional film 111 on a surface of the first cover 101 away from the encapsulation film 1004. The first functional film 111 includes an antireflection film, an anti-glare film, or a self-cleaning film.

The function of the photovoltaic curtain wall is mainly as a wall surface, a roof, etc. Therefore, during preparing of the photovoltaic curtain wall, the first functional film 111 covering at least a partial region of the surface of the first cover plate 101 far away from the encapsulation film 1004 can be formed, thereby improving the aesthetics or practicality of the photovoltaic curtain wall. The first functional film 111 includes an antireflection film, an anti-glare film, a self-cleaning film, and the like, based on different functional requirements. For example, in order to improve the photoelectric conversion efficiency of the photovoltaic curtain wall and reduce the influence of light reflected by the photovoltaic curtain wall on the surrounding environment, an antireflection film may be used as the first functional film 111. In order to reduce the interference of the glare generated by the reflected light of the photovoltaic curtain wall to users or pedestrians passing by and reduce potential safety hazard, an anti-glare film can be used as the first functional film 111. In order to ensure the aesthetic appearance of the photovoltaic curtain wall, a self-cleaning film can be used as the first functional film 111.

In addition, during constructing of the first functional film 111, only a single functional film may be used, or a plurality of functional films may be stacked in sequence. For example, an antireflection film may be formed on a surface of the first cover plate 101 away from the encapsulation film 1004, and then a self-cleaning film may be formed on the surface of the antireflection film away from the first cover plate 101, such that the antireflection film and the self-cleaning film are together used as the first functional film 111. Alternatively, an anti-glare film may be formed on the surface of the first cover plate 101 away from the encapsulation film 1004, and then a self-cleaning film is formed on the surface of the anti-glare film away from the first cover plate 101, such that the anti-glare film and the self-cleaning film are used together as the first functional film 111. Alternatively, an antireflection film is formed on the surface of the first cover plate 101 away from the encapsulation film 1004, and then an anti-glare film is formed on the surface of the antireflection film away from the first cover plate 101, such that the antireflection film and the anti-glare film are used together as the first functional film 111, etc. The embodiment of the present disclosure is not limited to the specific construction method of the first functional film 111.

Referring to FIGS. 12 to 16, in some embodiments, the photovoltaic curtain wall further includes a second functional film 112 on a surface of the second cover plate 105 away from the encapsulation film 1004. The second functional film 112 includes a colored glaze film, an embossed film, or an ultraviolet protection film.

Similar to the first functional film 111, during arranging of the second functional film 112, the second functional film 112 may be formed on a surface of the second cover plate 105 away from the encapsulation film 1004 based on different functional requirements. For example, in the case where it is necessary to improve the aesthetics of the photovoltaic curtain wall, a colored glaze film may be used as the second functional film 112, where the colored glaze film is a film layer having better wear resistance composed of different colors and patterns. In order to improve the user experience, an embossed film may be used as the second functional film 112. Alternatively, in order to reduce ultraviolet rays received by a user, an ultraviolet protection film may be used as the second functional film 112.

In addition, referring to FIG. 12 to FIG. 17, FIG. 17 is a schematic structural diagram of the photovoltaic curtain wall including both the first functional film 111 and the second functional film 112. During manufacturing of the photovoltaic curtain wall, both the first functional film 111 and the second functional film 112 may be respectively prepared for the photovoltaic curtain wall. Alternatively, the first functional film 111 or the second functional film 112 may only be prepared for the photovoltaic curtain wall. Alternatively, neither the first functional film 111 nor the second functional film 112 may be prepared. The specific functional film preparation selection may be adjusted according to the scenarios, which is not limited in the embodiment of the present disclosure.

In addition, when preparing the photovoltaic curtain wall, at least one lead-wire opening may be defined on the first cover plate 101, the second cover plate 105, or the encapsulation film 1004, and output wires of the cell string 103 may be led out through the at least one led-wire opening. In addition, at least one bypass diode can be connected in parallel for a sub-cell string (e.g., a cell unit) through the at least one lead-wire opening. The at least one bypass diode and the output wires may be connected to a photovoltaic box, and the photovoltaic box is used for ensuring insulation and safety of the bypass diodes and the output wires. Specifically, the photovoltaic box can be arranged on the back surface of the second cover plate 105 or at side corners of the photovoltaic curtain wall.

Figure 18:
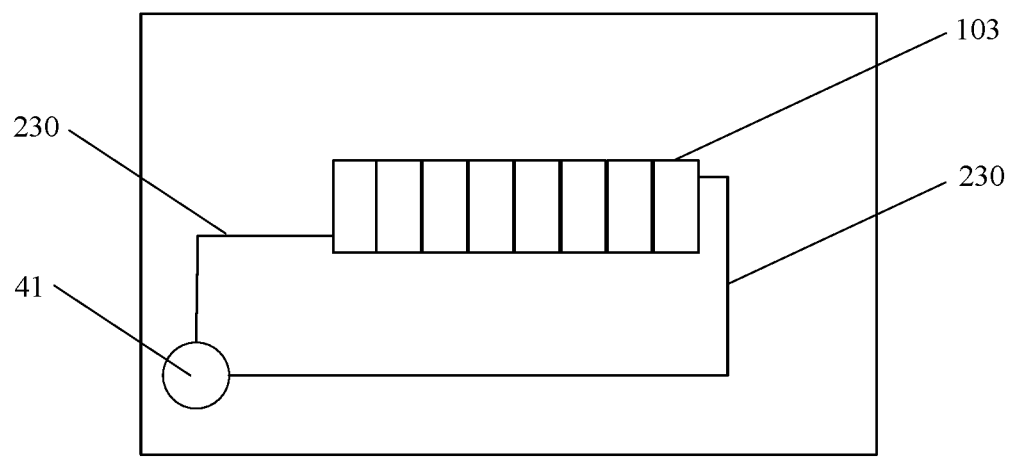
FIG. 18 is a schematic planar structural diagram of a lead-wire opening according to embodiments of the present disclosure.

Further referring to FIGS. 12 to 18, in some embodiments, the cell string 103 includes output wires 230 and the photovoltaic curtain wall further includes at least one lead-wire opening 41. The at least one lead-wire opening 41 is located on the first cover plate 101, the second cover plate 105, or the encapsulation film 1004, and is used for leading out the output wires 230. FIG. 18 is a schematic planar structural view of the lead-wire opening 41.

During the operation of the photovoltaic curtain wall, the electric energy generated by the cell string 103 may be output through the output wire 230. Therefore, the at least one lead-wire opening 41 leading out the output wires 230 can be defined in the photovoltaic curtain wall in advance. The at least one lead-wire opening 41 may be located on the first cover plate 101, the second cover plate 105, or the encapsulation film 1004.

Further, referring to FIG. 12 to FIG. 18 and FIG. 7, after the lead-wire opening is formed in the first cover plate 101 or the second cover plate 105, the film melted during the laminating is easily lost through the at least one lead-wire opening, so that the encapsulation film 1004 is prone to problems such as uneven film, lack of glue, or inclusion of bubbles. Therefore, during film laying, the fifth adhesive film 108 can be laid between the first cover plate 101 and the second cover plate 105 and at the position facing the lead-wire opening. An orthographic projection of the fifth adhesive film 108 on the cover plate surface 40 (i.e., the third surface described above) can completely cover the opening region 41 formed by the lead-wire opening on the cover plate surface 40, thereby effectively supplementing the film lost through the lead-wire opening during the laminating and improving the quality of the encapsulation film 1004.

The cover plate surface 40 may be a surface where the first cover plate 101 is in contact with the encapsulation film 1004 or a surface where the second cover plate 105 is in contact with the encapsulation film 1004.

According to embodiments of the present disclosure, the photovoltaic curtain wall includes the first cover plate 101, the cell string 103, and the second cover plate 105 which are laminated in the first direction; and the encapsulation film 1004 positioned between the first cover plate 101 and the second cover plate 105. During selecting of the second cover plate 105, a bending deformation occurred under a preset load is taken as the preset bending deformation, and a thickness of the target cover plate having a same material as the second cover plate 105 is taken as the equivalent thickness, and the second cover plate 105 having a thickness greater than or equal to the equivalent thickness and the first cover plate 101 having a thickness smaller than the second cover plate 105 are selected to form the photovoltaic curtain wall. By taking the thickness of the target cover plate that may be made of the same material as the second cover plate 105 and undergoes the bending deformation in response to the preset load as the preset bending deformation is regarded as the equivalent thickness, the second cover plate 105 with the thickness greater than or equal to the equivalent thickness is selected to prepare the photovoltaic curtain wall, such that the second cover plate 105 can independently bear the strength requirement for the photovoltaic curtain wall. During selecting of the first cover plate 101, the first cover plate 101 with the thickness less than the second cover plate 105 can be selected, and the thickness of the selected first cover plate 101 can be reduced further to improve the light transmittance of the first cover plate 101, thereby increasing the light energy received by the cell string 103 on the basis of ensuring the mechanical strength of the photovoltaic curtain wall, increasing the number of photo-generated carriers generated by the cell string 103, and further improving the photoelectric conversion efficiency and power generation of the photovoltaic curtain wall.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present disclosure is disclosed as above with preferred embodiments, it is not intended to limit the claims. Any person skilled in the art can make several possible changes and modifications without departing from the concept of the present disclosure. Therefore, the scope of protection of the present disclosure shall be subject to the scope defined in the claims of the present application.

Those of ordinary skill in the art will appreciate that the above-described embodiments are specific embodiments for implementing the present disclosure and that in practical application, various changes may be made in form and detail thereof without departing from the spirit and scope of the present disclosure. Any person skilled in the art may make various changes and modifications without departing from the spirit and scope of this disclosure, so the scope of protection of this disclosure shall be subject to the scope defined by the claims.

What is claimed is:

1. A photovoltaic curtain wall, comprising:
    a first cover plate, a cell string, and a second cover plate stacked sequentially in a first direction; and
    an encapsulation film disposed between the first cover plate and the second cover plate and wrapping the cell string, wherein the encapsulation film includes a first adhesive film and a second adhesive film, the first adhesive film is attached to the first cover plate, and the second adhesive film is attached to the second cover plate;
    wherein the second cover plate has a thickness greater than or equal to an equivalent thickness, and the first cover plate has a thickness less than the thickness of the second cover plate;
    wherein the equivalent thickness is a thickness of a target cover plate that is made of a same material as the second cover plate and that undergoes a preset bending deformation in response to a preset load;
    wherein the thickness of the second cover plate is less than or equal to 6 mm, or in a range of 8 mm to 12 mm, or greater than or equal to 15 mm, and wherein:
    in the case the thickness of the second cover plate is less than or equal to 6 mm, the second adhesive film has a thickness in the range of 0.7 mm to 1.6 mm;
    in the case the thickness of the second cover plate is in the range of 8 mm to 12 mm, a thickness of the second adhesive film is in a range of 1.1 mm to 1.6 mm; and
    in the case the thickness of the second cover plate is greater than or equal to 15 mm, the second adhesive film has a thickness in a range of 1.5 mm to 3 mm; and
    wherein the first adhesive film has a thickness in a range of 0.35 mm to 0.88 mm.

2. The photovoltaic curtain wall of claim 1, wherein a thickness difference between the first cover plate and the second cover plate is greater than 3 mm.

3. The photovoltaic curtain wall of claim 2, wherein the thickness difference between the first cover plate and the second cover plate is in a range of 3 mm to 15 mm.

4. The photovoltaic curtain wall of claim 1, wherein the thickness of the first cover plate is in a range of 1 mm to 4 mm.

5. The photovoltaic curtain wall of claim 4, wherein the thickness of the first cover plate is in a range of 1.1 mm to 2.75 mm.

6. The photovoltaic curtain wall of claim 4, wherein the thickness of the first cover plate is in a range of 3.5 mm to 3.8 mm.

7. The photovoltaic curtain wall of claim 1, wherein the cell string includes a plurality of sub-cell strings arranged at intervals in a second direction perpendicular to the first direction; and
    wherein any two adjacent sub-cell strings of the plurality of sub-cell strings are spaced apart from each other by 3 mm to 200 mm in the second direction.

8. The photovoltaic curtain wall of claim 7, wherein each respective sub-cell string includes a plurality of cells arranged in a third direction perpendicular to the first direction;
    any two adjacent cells of the plurality of cells are spaced apart from each other by 0 mm to 200 mm in the third direction.

9. The photovoltaic curtain wall of claim 8, wherein each respective cell of the plurality of cells includes a crystalline silicon cell, a cadmium telluride thin film cell, a copper indium gallium selenium thin film cell, a silicon-based thin film solar cell, or a laminated solar cell.

10. The photovoltaic curtain wall of claim 8, wherein each respective cell of the plurality of cells includes 2 to 20 main bus bars arranged at intervals.

11. The photovoltaic curtain wall of claim 8, wherein any two adjacent cells of the plurality of cells are at least partially overlapped.

12. The photovoltaic curtain wall of claim 1, wherein the photovoltaic curtain wall further comprises a first functional film located on a surface of the first cover plate away from the encapsulation film, and the first functional film includes an antireflection film, an anti-glare film, or a self-cleaning film.

13. The photovoltaic curtain wall of claim 12, wherein the photovoltaic curtain wall further comprises a second functional film on a surface of the second cover plate away from the encapsulation film, and the second functional film includes a colored glaze film, an embossed film, or an ultraviolet protection film.

14. The photovoltaic curtain wall of claim 1, wherein the encapsulation film further comprises:
    a third adhesive film laid between the first adhesive film and the second adhesive film, wherein the third adhesive film is facing an edge of the second cover plate, and the edge of the second cover plate is not covered by an orthographic projection of the cell string on the second cover plate.

15. The photovoltaic curtain wall of claim 14, wherein the third adhesive film has a width greater than or equal to 10 mm;

wherein the photovoltaic curtain wall further comprises a fourth adhesive film between target sub-cell strings of a plurality of sub-cell strings of the cell string, and the fourth adhesive film is respectively bonded with the first adhesive film and the second adhesive film, wherein the target sub-cell strings are adjacent sub-cell strings among the plurality of sub-cell strings, and a spacing between the target sub-cell strings in the second direction is greater than or equal to a preset value.

16. The photovoltaic curtain wall of claim 1, wherein the cell string comprises output wires, and the photovoltaic curtain wall further comprises at least one lead-wire opening defined on the first cover plate or the second cover plate, and the at least one lead-wire opening is used for leading out the output wires.

17. The photovoltaic curtain wall of claim 1, wherein the thickness of the first cover plate is less than or equal to 2 mm, or greater than 2 mm and less than or equal to 4 mm, and wherein:

in the case the thickness of the first cover plate is less than or equal to 2 mm, the first adhesive film has the thickness in the range of 0.3 mm to 1.2 mm; and in the case the thickness of the first cover plate is greater than 2 mm and less than or equal to 4 mm, the first adhesive film has the thickness in a range of 0.75 mm to 1.2 mm.

18. The photovoltaic curtain wall of claim 1, wherein the photovoltaic curtain wall further comprises a functional film on a surface of the second cover plate away from the encapsulation film, and the functional film includes a colored glaze film, an embossed film, or an ultraviolet protection film.

* * * * *